(12) United States Patent
Yamanaka

(10) Patent No.: US 8,093,905 B2
(45) Date of Patent: Jan. 10, 2012

(54) POWER SUPPLY DEVICE AND SEQUENCER SYSTEM

(75) Inventor: Takahiko Yamanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 524 days.

(21) Appl. No.: 12/375,897

(22) PCT Filed: Jul. 31, 2007

(86) PCT No.: PCT/JP2007/064989
§ 371 (c)(1),
(2), (4) Date: Feb. 17, 2009

(87) PCT Pub. No.: WO2008/016050
PCT Pub. Date: Feb. 7, 2008

(65) Prior Publication Data
US 2010/0007361 A1    Jan. 14, 2010

(30) Foreign Application Priority Data
Jul. 31, 2006   (JP) .................................. 2006-208681

(51) Int. Cl.
*G01R 31/12* (2006.01)
*G01R 31/00* (2006.01)
(52) U.S. Cl. ......................................... 324/548; 702/58
(58) Field of Classification Search ................... 324/548; 702/58
See application file for complete search history.

(56) References Cited

U.S. PATENT DOCUMENTS

| | | | |
|---|---|---|---|
| 4,546,647 A * | 10/1985 | Takahashi | 73/114.32 |
| 5,430,636 A * | 7/1995 | Kachi | 363/58 |
| 6,678,174 B2 * | 1/2004 | Suzui et al. | 363/55 |
| 6,880,967 B2 | 4/2005 | Isozumi et al. | |
| 7,586,727 B2 * | 9/2009 | Yamashita | 361/93.9 |
| 2002/0085397 A1 | 7/2002 | Suzui et al. | |
| 2005/0169018 A1 | 8/2005 | Hatai et al. | |

FOREIGN PATENT DOCUMENTS

| | | |
|---|---|---|
| EP | 2 177 923 A1 | 4/2010 |
| JP | 04-208873 A | 7/1992 |
| JP | 07-007922 A | 1/1995 |
| JP | 07-043019 A | 2/1995 |
| JP | 08-029465 A | 2/1996 |
| JP | 09-257856 A | 10/1997 |
| JP | 11-356036 A | 12/1999 |
| JP | 2001-231253 A | 8/2001 |
| JP | 2002-281735 A | 9/2002 |
| JP | 2003-243269 A | 8/2003 |
| JP | 2004-309375 A | 11/2004 |
| JP | 2006-0284605 A | 10/2006 |

OTHER PUBLICATIONS

German Office Action in corresponding German Patent Application No. 11 2007 001 787 dated Mar. 7, 2011.

* cited by examiner

*Primary Examiner* — Jeff Natalini
(74) *Attorney, Agent, or Firm* — Sughrue Mion, PLLC

(57) ABSTRACT

A smoothing unit includes a first and a second smoothing capacitors, a first and a second discharge resistors connected in parallel to both ends of the first and the second smoothing capacitors, respectively. During a normal operation, both the first and the second smoothing capacitors are connected electrically to a live line. On the other hand, during a degradation diagnosis, the first and the second smoothing capacitors are alternately connected electrically to the live line at a predetermined timing, and a smoothing capacitor not electrically connected to the live line is subjected to the degradation diagnosis.

22 Claims, 19 Drawing Sheets

A: NORMAL RANGE (INITIAL FLUCTUATION PERIOD)
B: NORMAL RANGE (CAPACITANCE STABLE PERIOD)
C: REPLACING RECOMMENDATION RANGE
D: DEGRADED RANGE

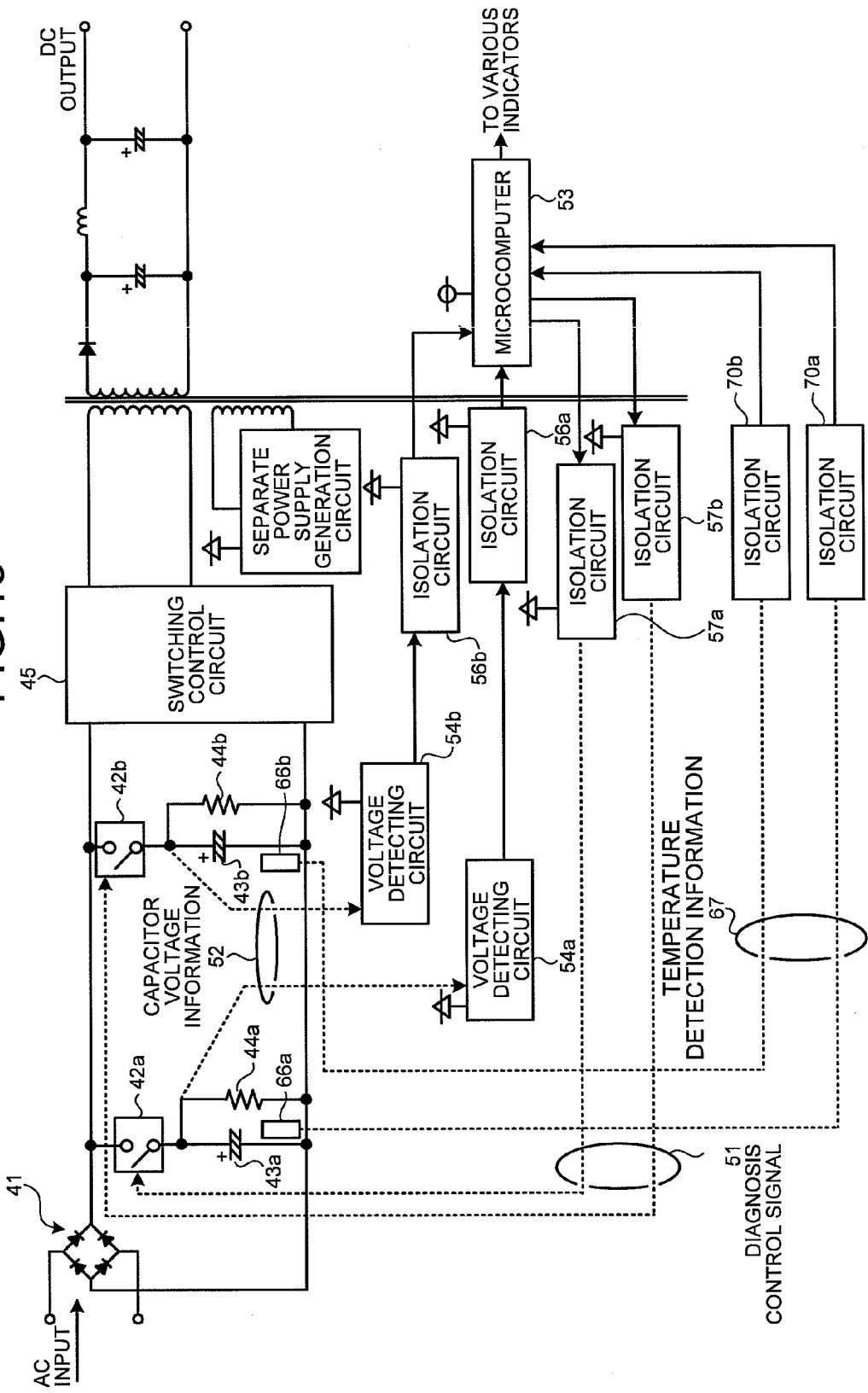

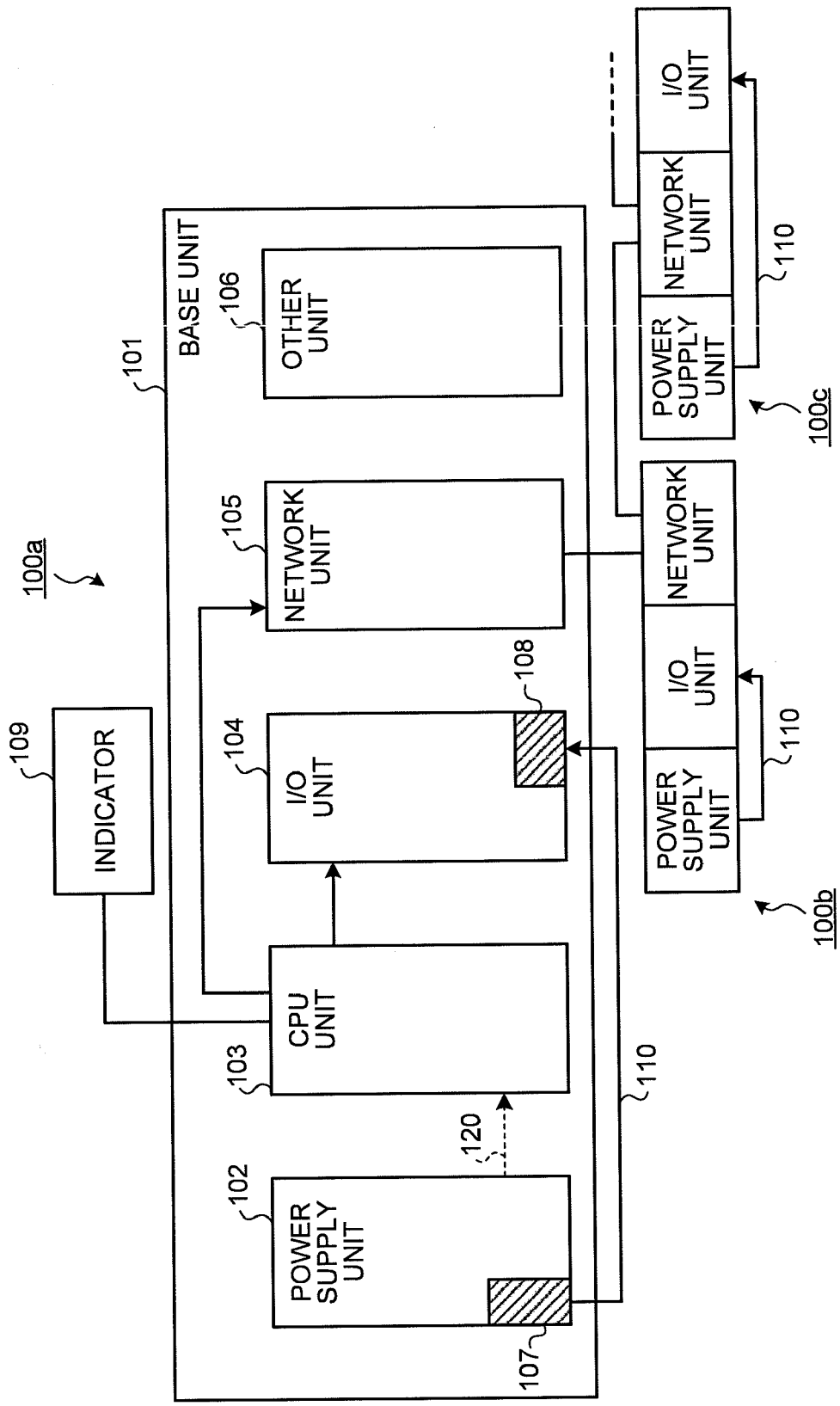

POWER SUPPLY DEVICE AND SEQUENCER SYSTEM

TECHNICAL FIELD

The present invention relates to a power supply device, and more particularly, to a power supply device that performs a life diagnosis of a smoothing capacitor that smoothes a rectified output of an alternating-current power and a sequencer system including the power supply device.

BACKGROUND ART

A number of expendable components having a finite life, such as an aluminum electrolytic capacitor, have hitherto been used in a power supply device, so that the power supply device itself has been considered as a component having its set life.

If a power supply device comes to an end of its life or if a power supply device is unexpectedly broken down resulting in a system down, a production line is stopped leading to a large influence on users, for example, leading to a prolonged down time.

Further, in recent years, in the market, there are ever-increasing demands from users that a life diagnosis function is provided in a power supply device, and the cost of maintenance is decreased by preventive maintenance during operation to shorten the down time.

A direct-current power supply device that can detect a time for replacement of a smoothing capacitor due to its life and can predict the life of the smoothing capacitor is disclosed in Patent Document 1.

Patent Document 1: Japanese Patent Application Laid-open No. H11-356036

DISCLOSURE OF INVENTION

Problem to be Solved by the Invention

However, in the conventional technology disclosed, for example, in Patent Document 1, the life diagnosis of the power supply device is performed exclusively based on a ripple voltage in an output voltage of a smoothing capacitor, a direct measurement of the temperature of the capacitor, and an accumulated elapsed time. Accordingly, the characteristics of a capacitor connected to a live line are not directly measured, and, thus, the prediction accuracy of the life diagnosis is insufficient. Therefore, for example, even in a power supply device with an expected life of 10 years, a preventive maintenance, such as a replacement of the power supply device, should be performed in an early stage, which is disadvantageously causative of an increased maintenance cost.

Another conventional power supply device has a configuration that, unlike the system disclosed in Patent Document 1, the capacitance of a smoothing capacitor is actually measured when the power supply device is in an offline, and the remaining life is estimated by comparing the measured capacitance with an initial capacitance. Although this technique is advantageous in that the high accuracy of the life diagnosis can be achieved, the technique suffers from a problem that, since the life diagnosis cannot be performed during the operation of the power supply device (hereinafter, "online"), the life diagnosis causes the production line to be once stopped, leading to an increased down time.

The present invention has been made in view of the above aspects, and an object of the present invention is to provide a power supply device that, in performing a life diagnosis of the power supply device, can realize an online life diagnosis while ensuring the prediction accuracy of the life diagnosis, and to provide a sequencer system including such a power supply device.

Means for Solving Problem

To solve the above problems and to achieve the object, the power supply device according to the present invention performs a degradation diagnosis of a smoothing capacitor provided in a smoothing unit that smoothes the rectified output of an alternating-current power. The power supply device includes, as the smoothing capacitor in the smoothing unit, a first smoothing capacitor and a second smoothing capacitor, and a first discharge resistor and a second discharge resistor connected in parallel to both ends of the first smoothing capacitor and both ends of the second smoothing capacitor, respectively. During a normal operation, both the first smoothing capacitor and the second smoothing capacitor are connected electrically to a live line. However, during a degradation diagnosis, the first smoothing capacitor and the second smoothing capacitor are alternately connected electrically to the live line at a predetermined timing, and the degradation diagnosis is performed on the smoothing capacitor that is not connected electrically to the live line.

EFFECT OF THE INVENTION

With a power supply device according to the present invention, when a first smoothing capacitor and a second smoothing capacitor provided in a smoothing unit that smoothes the rectified output of the alternating-current power are alternately connected electrically to a live line at a predetermined timing, a degradation diagnosis is performed on the smoothing capacitor that is not connected electrically to the live line. By virtue of this configuration, the power supply device is advantageous in that an online life diagnosis can be performed while ensuring the prediction accuracy of the life diagnosis.

BRIEF DESCRIPTION OF DRAWINGS

FIG. 18 is a diagram showing the configuration of the power supply device according to the fifth embodiment with a temperature detecting unit additionally provided in the capacitor that is directly subjected to a degradation diagnosis.

FIG. 19 is a diagram showing an example of configuration of a sequencer system in which the power supply device according to one of the first to the seventh embodiments of the present invention is applied.

Figure 1:
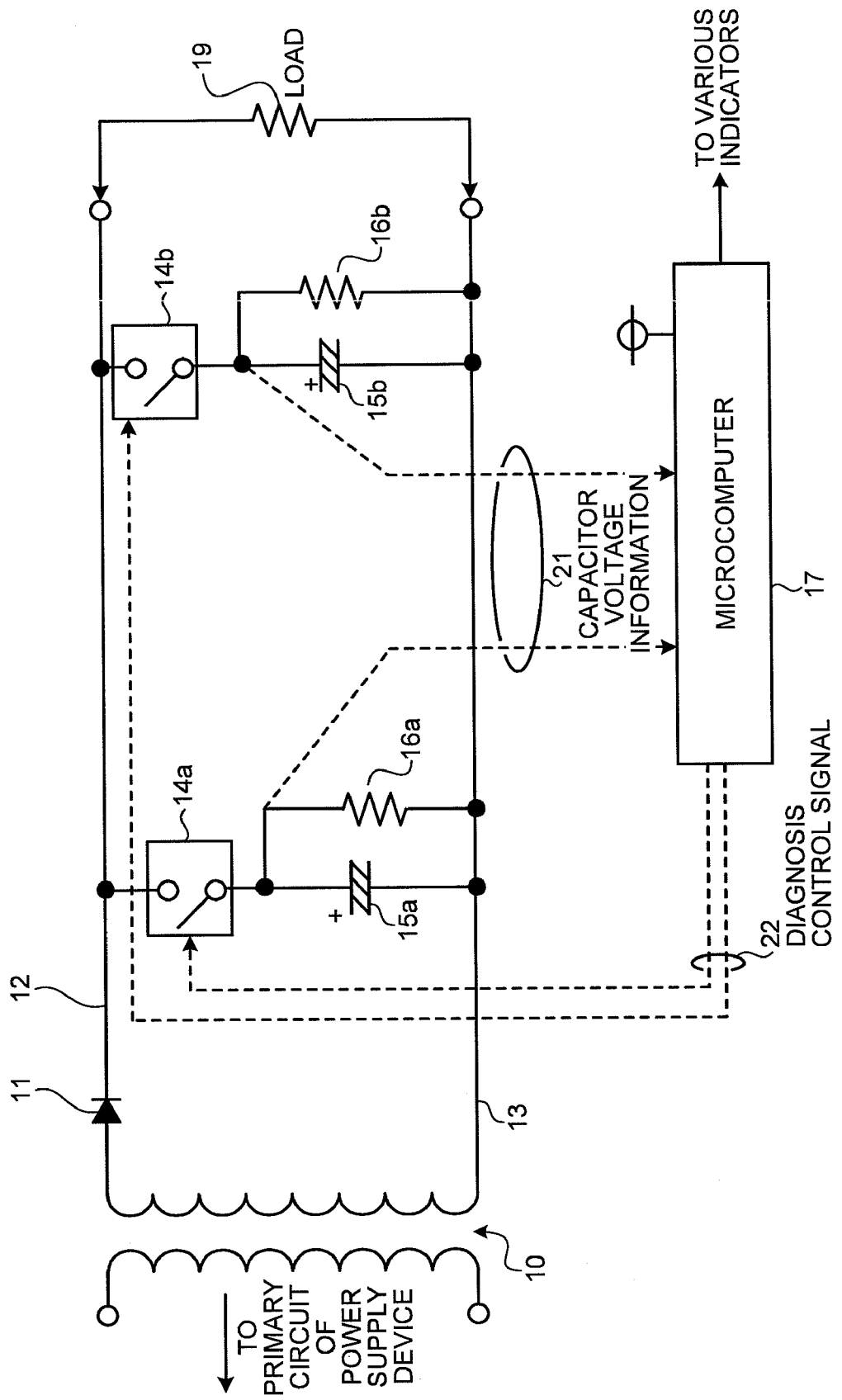
FIG. 1 is a circuit diagram showing the configuration of a power supply device according to a first embodiment of the present invention.

EXPLANATIONS OF LETTERS OR NUMERALS 10 transformer
11 diode
12 load connecting line (high-potential side)
13 load connecting line (low-potential side)
14a, 14b, 14k, 14p, 34a, 34b, 42a, 42b switching elements
15a, 15b, 15k, 15p, 15t, 15z, 43a, 43b smoothing capacitors
16a, 16b, 16k, 16p discharge resistors
17, 47, 53 microcomputers
19 load
21, 52 capacitor voltage information
22, 51 diagnosis control signals
31a, 31b delaying capacitors
32a, 32b, 33a, 33b, 35a, 35b resistors
36a, 36b coupling capacitors
41 full-wave rectifier circuit
45 switching control circuit
54a, 54b voltage detecting circuits
56a, 56b, 57a, 57b, 70a, 70b isolation circuits
65 capacitor
66 temperature detecting unit
67 temperature detection information
100a, 100b, 100c control systems
101 base unit
102 power supply unit
103 CPU unit
104 I/O unit
105 network unit
106 other unit
107 external output connector
108 external input connector
109 indicator
110, 120 life detection signals

BEST MODE(S) FOR CARRYING OUT THE INVENTION

Exemplary embodiments of a power supply device and a sequencer system according to the present invention will be explained in detail with reference to the accompanying drawings. However, it should be noted that the present invention is not limited to the embodiments.

First Embodiment

FIG. 1 is a circuit diagram showing the configuration of a power supply device according to a first embodiment of the present invention. In the embodiment, in the power supply device on its secondary side (a power supply device on a load side as viewed from a power transformer), a smoothing capacitor provided in a smoothing unit that smoothes the rectified output of the alternating-current power is duplexed, and a degradation diagnosis of the duplexed smoothing capacitor is performed, whereby an online life diagnosis of the power supply device per se can be performed.

Next, the circuit configuration of the power supply device shown in FIG. 1 will be explained. In this drawing, a transformer 10 for supplying a predetermined alternating-current power to a secondary circuit in the power supply device is provided. A diode 11 as a rectifier is inserted on a load connecting line 12 as a high-potential side live line for connecting one end of the transformer 10 to a load 19. At a position near the load 19 rather than the diode 11, a smoothing capacitor 15a, for example, an electrolytic capacitor, is inserted between the load connecting line 12 on a high-potential side and a load connecting line 13 as a low-potential side live line through a switching element 14a, for example, a P channel-type MOS switch, so that a negative pole terminal of the smoothing capacitor 15a per se is connected to the load connecting line 13 on the low-potential side. Further, a discharge resistor 16a for performing a life diagnosis of the capacitor is connected to both ends of the smoothing capacitor 15a. The same connection configuration is taken among a switching element 14b, a smoothing capacitor 15b, and a discharge resistor 16b and is inserted between the load connecting line 12 on the high-potential side and the load connecting line 13 on the low-potential side. That is, in the power supply device according to the embodiment, the smoothing capacitors 15a, 15b, the switching elements 14a, 14b connected in series to the smoothing capacitors 15a, 15b, respectively, and the discharge resistors 16a, 16b connected in parallel to the smoothing capacitors 15a, 15b, respectively, constitute the smoothing unit. Further, the conduction of both the switching elements 14a, 14b provided in the smoothing unit can realize a duplexed configuration of the smoothing unit by the smoothing capacitors 15a, 15b.

A microcomputer 17 is provided as a control unit for controlling the secondary circuit. More specifically, the microcomputer 17 performs on-off control of the switching elements 14a, 14b connected respectively to the smoothing capacitors 15a, 15b based on information 21 on the voltage of the smoothing capacitors 15a, 15b (hereinafter, "capacitor voltage information"). The microcomputer 17 performs a degradation diagnosis of the smoothing capacitors 15a, 15b based on the capacitor voltage information 21 and, at the same time, informs an indicator such as a light emitting diode (LED) (not shown) of the results of the degradation diagnosis to display the results.

FIG. 1 is a diagram showing an example of the configuration of the embodiment. Various changes may be made without departing from the scope of the invention. For example, in the configuration shown in FIG. 1, the switching elements 14a, 14b provided on the high-potential side are explained as a P-channel switching element. In principle, however, any type of switching element may be used. In this connection, it is a matter of course that, from the viewpoint of simply configuring the power supply device, an exemplary type of switching element is preferably selected depending, for example, upon the position of each switching element disposed.

Figure 2:
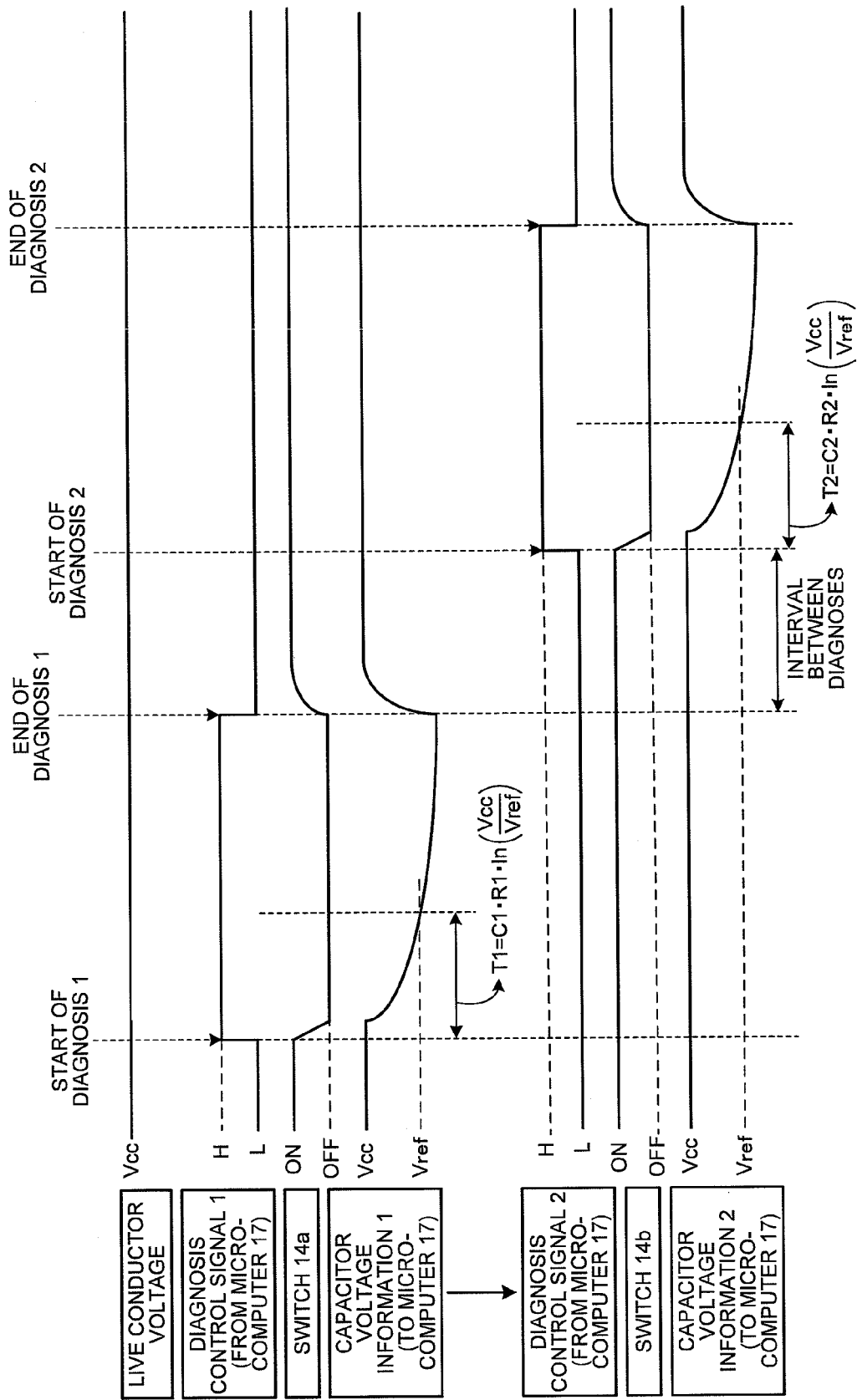
FIG. 2 is a timing chart for explaining the operation of the power supply device shown in FIG. 1.

The operation of the power supply device shown in FIG. 1 will be explained with reference to FIGS. 1 and 2. FIG. 2 is a timing chart for explaining the operation of the power supply device shown in FIG. 1. In FIG. 2, for a diagnosis phase for performing a diagnosis of the smoothing capacitor 15a which is a first capacitor in the duplexed capacitor, a numeral "1" is attached to the end of the letter, and, for a diagnosis phase for performing a diagnosis of the smoothing capacitor 15b as a second capacitor, a numeral "2" is attached to the end of the letter. For example, "diagnosis 1", "diagnosis control signal 1", and "capacitor voltage information 1" are respectively a diagnosis phase, a diagnosis control signal, and a capacitor voltage information for performing a diagnosis of the smoothing capacitor 15a.

At the outset, an assumption is made that the power supply device is under such a state that a predetermined live line voltage (Vcc) is applied to the load, and any degradation diagnosis is not performed for the smoothing capacitors 15a, 15b (hereinafter, "during a normal operation"). During this normal operation, both the switching elements 14a, 14b are maintained in an "on" state, and the smoothing capacitors 15a,15b are connected electrically between the load connecting line 12 on the high-potential side (Vcc) and the load connecting line 13 on the low-potential side (0V).

Next, a diagnosis control signal 1, which is output from the microcomputer 17 to the switching element 14a, is changed from "L" to "H". In this case, the switching element 14a is changed from the "on" state to an "off" state, and the smoothing capacitor 15a is disconnected electrically from the load connecting line. When the switching element 14a is turned "off", charges accumulated in the smoothing capacitor 15a are discharged through the discharge resistor 16a. When a signal of "H" is output from the microcomputer 17 to the switching element 14a, any signal of "H" is not output as a diagnosis control signal 2 from the microcomputer 17 to the switching element 14b. That is, both the smoothing capacitor 15a and smoothing capacitor 15b are not simultaneously disconnected electrically from the load connecting line.

When the resistance of the switching element 14a in a conduction state is presumed to be "0Ω" and the time necessary for the voltage of the smoothing capacitor 15a to be lowered from Vcc (the voltage of the live line) to Vref (for example, a predetermined specified voltage from zero to Vcc) is designated as a discharge reference time T1, the discharge reference time T1 can be expressed by the following equation.

$$T1 = C1 \cdot R1 \cdot ln(Vcc/Vref) \tag{1}$$

C1: capacitance of smoothing capacitor 15a
R1: resistance of discharge resistor 16a The microcomputer 17 measures a time Tm1 taken until, upon the start of the discharge, the voltage of the smoothing capacitor 15 reaches Vref from Vcc, and holds the measuring time Tm1. Further, the microcomputer 17 outputs information on the state of a degradation in the smoothing capacitor 15a based on the measuring time Tm1 to an indicator such as LED.

In the timing chart shown in FIG. 2, after the discharge of the smoothing capacitor 15a proceeds to a certain extent, the diagnosis control signal 1 output from the microcomputer 17 to the switching element 14a is changed from "H" to "L" to end diagnosis 1. In this case, the switching element 14a is changed from the "off" state to an "on" state, and the smoothing capacitor 15a is electrically connected between the load connecting lines. When the switching element 14a is turned "on", the smoothing capacitor 15a is charged, and, after the elapse of a predetermined period of time, the voltage is returned to the original voltage (Vcc).

Subsequently, a degradation diagnosis of the smoothing capacitor 15b is performed. The degradation diagnosis of the smoothing capacitor 15b may be performed at any desired timing. This degradation diagnosis, however, is preferably performed, after the diagnosis control signal 1 output to the switching element 14a is brought to "L" and a satisfactory voltage is accumulated in the smoothing capacitor 15a to render the live line voltage of the load connecting line satisfactorily stable.

The degradation diagnosis of the smoothing capacitor 15b is then performed. This degradation diagnosis is the same as that of the smoothing capacitor 15a, and, thus, a detailed explanation thereof will be omitted. As with the discharge reference time T1, the discharge reference time T2 necessary for the voltage of the smoothing capacitor 15b to be lowered from Vcc to Vref may be expressed by the following equation.

$$T2 = C2 \cdot R2 \cdot ln(Vcc/Vref) \tag{2}$$

C2: capacitance of smoothing capacitor 15b
R2: resistance of discharge resistor 16b In the degradation diagnosis, the microcomputer 17 measures a time Tm1 taken until the voltage of the smoothing capacitor 15a reaches Vref from Vcc, and, further, the degradation diagnosis of the smoothing capacitor 15a is performed based on the measuring time Tm1. Alternatively, a method may also be adopted in which a terminal voltage Vm1 of the smoothing capacitor 15a is measured after the elapse of a discharge reference time T1 from the start of the discharge and the degradation diagnosis of the smoothing capacitor 15a is performed based on the measured terminal voltage Vm1.

Figure 3:
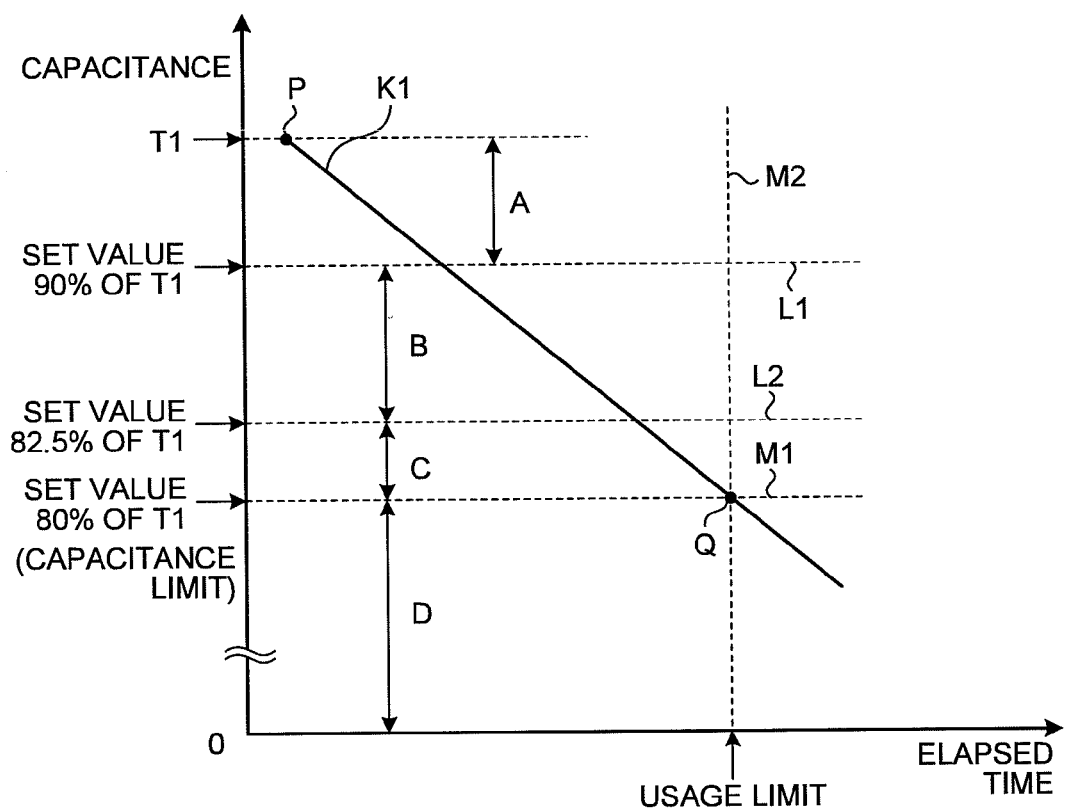
FIG. 3 is a graph showing a state classification of a capacitor provided on a degradation curve for the capacitance of a capacitor.

FIG. 3 is a graph showing state classes of a capacitor on a degradation curve for the capacitance of the capacitor. In the drawing, a solid line K1 is a degradation curve showing a degradation in the capacitance plotted against the duration of service of the capacitor, and a dashed line Ml represents a capacitance limit line showing the limit of capacitance at which the use of the power supply device becomes impossible. A dashed line M2, which passes through an intersection Q between the dashed line M1 and the degradation line K1 and is perpendicular to the dashed line M1, represents a usage limit line showing the boundary of the serviceable period of the capacitor. Since the capacitor has a limited life, as with the degradation curve K1, the capacitance lowers with the duration of service and, as a result, the stored charge volume is reduced. When the duration of service exceeds the serviceable limit specified by the usage limit line M2, the capacitance of the capacitor reaches a value below the limit specified by the capacitance limit line M1, making it impossible to supply a highly stable electric power to the load.

The degradation curve K1 shown in FIG. 3 shows general (or ideal) degradation characteristics of the capacitance of the capacitor. Accordingly, a capacitor in actual use is not always in agreement with the degradation curve K1. Therefore, in the embodiment, boundary lines L1, L2 parallel to the capacitance limit line M1 are provided above the capacitance limit line M1 on its side remote from the origin, and the following four sections A, B, C, and D divided by the boundary lines L1, L2 and M1 are defined (see FIG. 3).

(1) Section A: normal range (initial fluctuation period: part above L1)

(2) Section B: normal range (capacitance stable period: part between L1 and L2)

(3) Section C: replacing recommendation range (part between L2 and M1)

(4) Section D: degraded range (part below M1)

In the example shown in FIG. 3, the capacitance of the capacitor, which determines the boundary line L1, is set, for example, to 90% of the discharge reference time T1 (point P in the drawing) represented by equation (1), the capacitance, which determines the boundary line L2, is set, for example, to 82.5% of the discharge reference time T1, and the capacitance, which determines the boundary line M1, is set, for example, to 80% of the discharge reference time T1. The capacitances may of course be set to other values.

Figure 4:
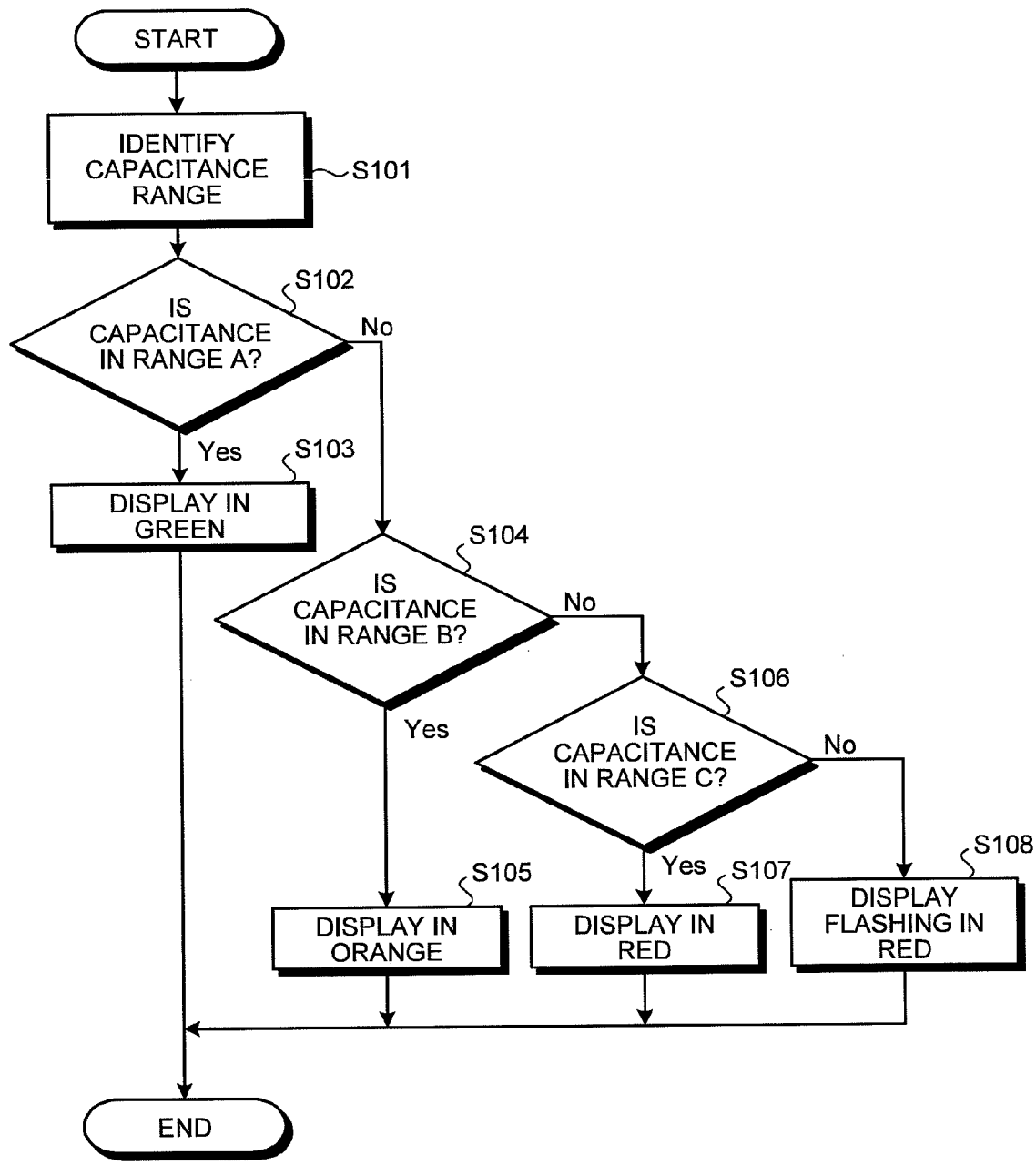
FIG. 4 is a flowchart showing a control flow of display control for the power supply device.

A display control function in the indicator such as LED will be explained with reference to each of FIGS. 1 to 4. FIG. 4 is a flowchart showing a control flow in the display control of the power supply device. A display control function in the degradation diagnosis of the smoothing capacitor 15a will be explained as an example.

In FIG. 4, a diagnosis control signal is first output from the microcomputer 17. The discharge time Tm1 of the smoothing capacitor 15a is measured, and the range of the capacitance of the capacitor is identified (Step S101). For example, when the discharge time Tm1 of the smoothing capacitor 15a falls within a value between the discharge reference time T1 and 90% of the discharge reference time T1, the capacitance of the smoothing capacitor 15a is identified to fall within the range of section A. Further, for example, when the discharge time Tm1 of the smoothing capacitor 15a is not more than the set value 80% of the discharge reference time T1, the capacitance of the smoothing capacitor 15a is identified to fall within the range of section D.

Whether the capacitance of the capacitor identified in Step S101 falls within the range of section A is then determined (Step S102). When the identified capacitance of the capacitor falls within the range of section A (Step S102, Yes), this fact is displayed, for example, in a green color with an indicator such as LED (Step S103). On the other hand, when the identified capacitance of the capacitor does not fall within the range of section A (Step S102, No), whether the identified capacitance of the capacitor falls within the range of section B is determined (Step S104). When the identified capacitance of the capacitor falls within the range of section B (Step S104, Yes), this fact is displayed, for example, in an orange color with an indicator such as LED (Step S105). On the other hand, when the identified capacitance of the capacitor does not fall within the range of section B (Step S104, No), whether the identified capacitance of the capacitor falls within the range of section C is determined (Step S106). When the identified capacitance of the capacitor falls within the range of section C (Step S106, Yes), this fact is displayed, for example, in a red color with an indicator such as LED (Step S107). On the other hand, when the identified capacitance of the capacitor does not fall within the range of section C (Step S106, No), this fact is displayed, for example, by flashing in a red color with an indicator such as LED (Step S108). The indication may be carried out by a digital display utilizing a 7-segment LED indicator.

A user can properly grasp the time for replacement of the smoothing capacitor used in the power supply device, or the time for replacement of the power supply device per se by the display control processing in Steps S101 to S108.

Finally, regarding the first embodiment, the capacitance of each of the duplexed smoothing capacitors (smoothing capacitors 15a, 15b) will be explained. For example, upon the disconnection of the smoothing capacitor 15a from the live line (load connecting line 12), electric power supplied to the load 19 relies upon only the smoothing capacitor 15b although this is temporary. When the number of the smoothing capacitors is reduced from two to one, the ripple of the live line is increased, resulting in degraded quality of power supply voltage. Accordingly, in the power supply device of the embodiment, preferably, the smoothing capacitors 15a, 15b each have capacitance characteristics on a satisfactory level that, even when the smoothing capacitors 15a, 15b are operated solely, electric power can be supplied highly stably to the load.

Second Embodiment

Figure 5:
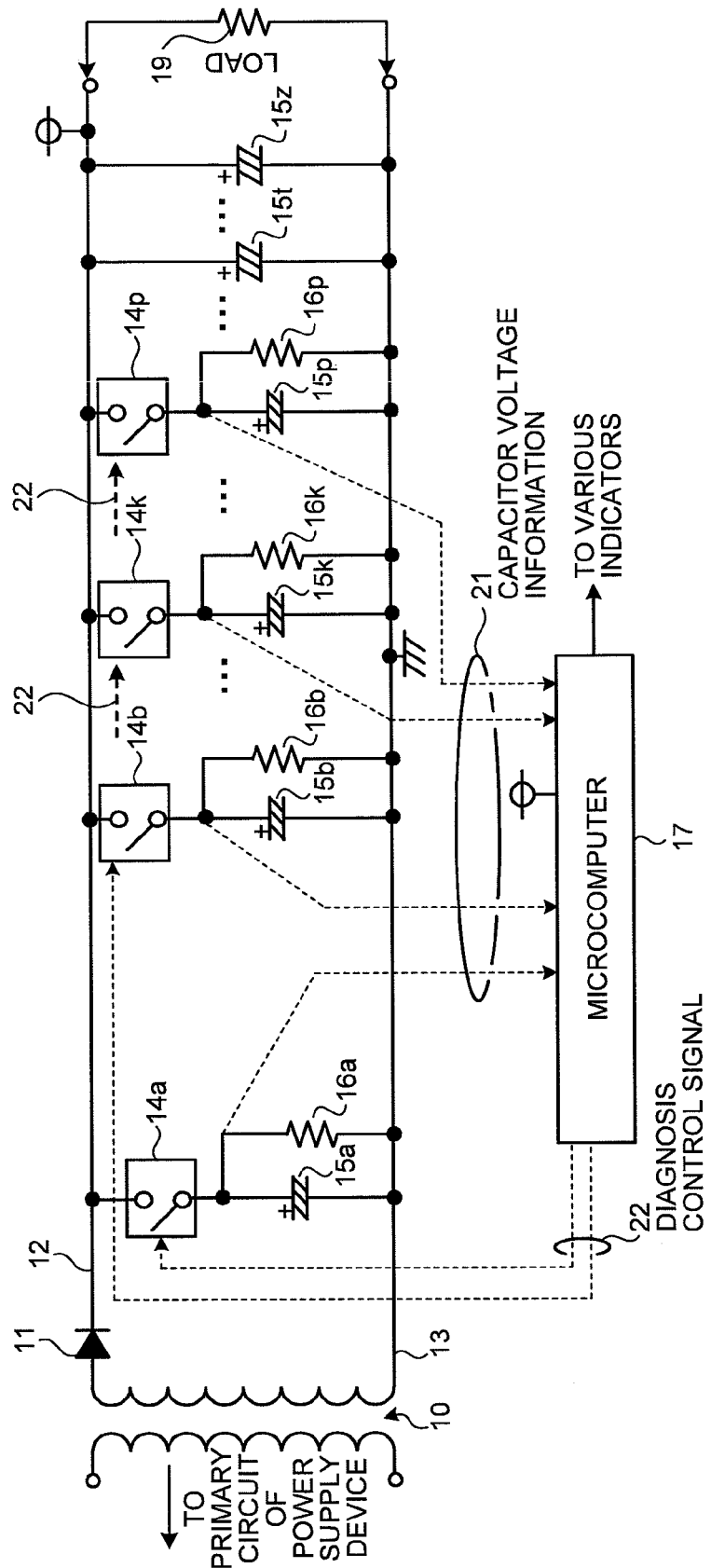
FIG. 5 is a circuit diagram showing the configuration of a power supply device according to a second embodiment of the present invention.

FIG. 5 is a circuit diagram showing the configuration of a power supply device according to a second embodiment of the present invention. In the power supply device according to the first embodiment shown in FIG. 1, the smoothing capacitor has a duplexed configuration. On the other hand, the power supply device according to the second embodiment shown in FIG. 5 has a configuration which can cope with a requirement for the provision of three or more smoothing capacitors. Specifically, in the circuit configuration shown in FIG. 5, each of the smoothing capacitors (15a, 15b, . . . , 15k, . . . , 15p, . . . ) is inserted between a load connecting line 12 on a high-potential side and the load connecting line 13 on a low-potential side through a switching element (14a, 14b, . . . , 14k, . . . , 14p, . . . ). Further, a discharge resistor (16a, 16b, . . . , 16k, . . . , 16p, . . . ) for a life diagnosis is connected to both ends of each of the smoothing capacitors. All the smoothing capacitors connected in parallel to each other are not always required to undergo a degradation diagnosis, and smoothing capacitors not subjected to a degradation diagnosis, for example, smoothing capacitors (15t, . . . 15z) shown in FIG. 5 may exist.

Also in the power supply device according to the embodiment, the degradation diagnosis of each smoothing capacitor may be performed in the same manner as in the first embodiment. In the power supply device according to the embodiment, however, as described above, three or more smoothing capacitors are inserted between the load connecting line 12 on the high-potential side and the load connecting line 13 on the low-potential side. Therefore, the power supply device according to the second embodiment has features different from the power supply device according to the first embodiment. The features of the power supply device according to the second embodiment will be explained.

(Shortening of Diagnosis Intervals)

In the power supply device according to the first embodiment, as explained above, in performing a degradation diagnosis of a second smoothing capacitor after a degradation diagnosis of a first smoothing capacitor, the degradation diagnosis of the second smoothing capacitor is preferably performed after satisfactorily stabilizing the voltage of the live line. On the other hand, in the power supply device according to the embodiment, even when one smoothing capacitor is disconnected from the live line, a fluctuation in voltage of the live line can be suppressed to a lower level by the other smoothing capacitors. Accordingly, the intervals of the degradation diagnosis of the smoothing capacitors can be shortened as compared with the intervals in the first embodiment.

(Simultaneous Degradation Diagnosis of a Plurality of Smoothing Capacitors)

In the power supply device according to the embodiment, a simultaneous degradation diagnosis of a plurality of smoothing capacitors can be realized although whether the simultaneous degradation diagnosis is possible depends, for example, upon the number of smoothing capacitors inserted between the load connecting lines and the capacitance of the smoothing capacitors per se. For example, in FIG. 5, a degradation diagnosis of the smoothing capacitor 15a and a degradation diagnosis of the smoothing capacitor 15b can be performed simultaneously (around the same time). Therefore, the time necessary for the degradation diagnosis does not always increase proportionally with the number of smoothing capacitors, and the total time of the degradation diagnosis can be effectively reduced according to the number and capacitance of smoothing capacitors.

(Reduction in Capacitance of Smoothing Capacitors)

In the power supply device according to the first embodiment, as described above, preferably, the smoothing capacitors each have capacitance characteristics on a satisfactory level that, even when only any one of the smoothing capacitors 15a, 15b is operated, electric power can be supplied highly stably to the load. On the other hand, in the power supply device according to the embodiment, even when one smoothing capacitor is disconnected, from the live line, for the degradation diagnosis, a fluctuation in voltage of the live line can be suppressed to a lower level through cooperation with the other smoothing capacitors. Accordingly, the capacitance of each of the smoothing capacitors may be lower than the capacitance in the first embodiment.

Third Embodiment

Figure 6:
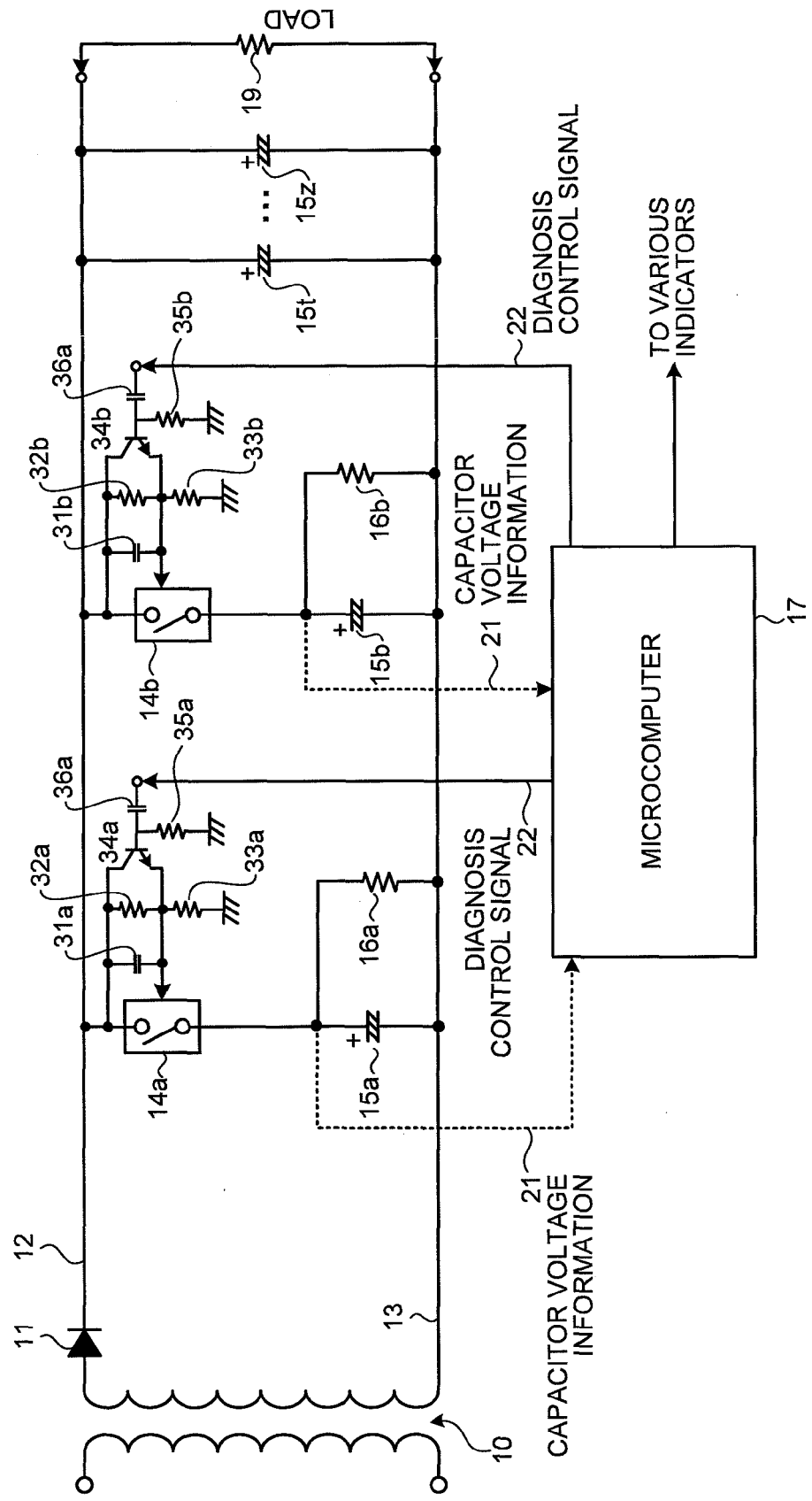
FIG. 6 is a circuit diagram showing the configuration of a power supply device according to a third embodiment of the present invention.

FIG. 6 is a circuit diagram showing the configuration of a power supply device according to a third embodiment of the present invention. In the power supply device according to the third embodiment shown in FIG. 6, the configuration of a startup circuit that starts and controls each switching element for electrically connecting a smoothing capacitor between load connecting lines is shown. Specifically, in the circuit configuration shown in FIG. 6, for the switching elements 14a, 14b, a startup circuit including a combination of a switching element with a capacitor and a resistor is configured. In FIG. 5 showing the configuration of the second embodiment and FIG. 6 showing the configuration of the third embodiment, identical or equivalent configurations have the same reference characters, and the overlapped description thereof will be omitted. Here only processing different from the processing in the first and the second embodiments will be explained.

In FIG. 6, a delaying capacitor 31a is connected to one end (for example, a source end of MOSFET) and a control end (for example, a gate end of MOSFET) of the switching element 14a. A resistor 32a is connected to both ends of the delaying capacitor 31a. The resistor 32a is connected in series to a resistor 33a to constitute a voltage dividing circuit that divides the voltage of the live line. Ends of a switching element 34a (for example, a collector end and an emitter end in a bipolar transistor) are connected to respective ends of the delaying capacitor 31a. One end of a coupling capacitor 36a, which mediate the input of a diagnosis control signal 22 output from the microcomputer 17, and one end of the resistor 35a for applying a bias voltage to the switching element 34a are connected to the control end (base end). The same startup circuit is configured for the switching element 14b.

Next, two characteristic functions (function of delaying capacitor and function of coupling capacitor) in the startup circuit will be explained.

(Function of Delaying Capacitor)

The delaying capacitor 31a slowly turns on the switching element 14a on one hand and quickly turns off the switching element 14a on the other hand. Specifically, when the smoothing capacitor 15a is connected to the live line, the operation of the switching element 14a from "off" to "on" is slowly performed. On the other hand, when the smoothing capacitor 15a is disconnected from the live line, the operation of the switching element 14a from "on" to "off" is performed at a high speed.

When the smoothing capacitors are connected to the live line, a voltage fluctuation occurs because the voltage of the live line is different from the voltage of the smoothing capacitors. This voltage fluctuation is significant when the number of smoothing capacitors connected in parallel to each other is small as in the power supply device shown in FIG. 1. On the other hand, as explained above, the delaying capacitor slowly connects the smoothing capacitors to the live line. Accordingly, a voltage fluctuation in the connection of the smoothing capacitors to the live line can be suppressed. When the smoothing capacitors are disconnected from the live line, as described above, the delaying capacitor disconnects the smoothing capacitors from the live line at a high speed. Accordingly, while maintaining the voltage in the disconnection, subsequent operation of a degradation diagnosis can be quickly performed.

(Function of Coupling Capacitor)

The coupling capacitor 36a has the function of blocking direct-current signals, and, thus, the switching element 14a can be controlled only upon a change in the diagnosis control signal 22. Therefore, transfer to a diagnosis phase for performing the diagnosis of the smoothing capacitor 15a can be reliably performed, and the probability of erroneous transfer to the diagnosis phase can be reduced.

Fourth Embodiment

Figure 7:
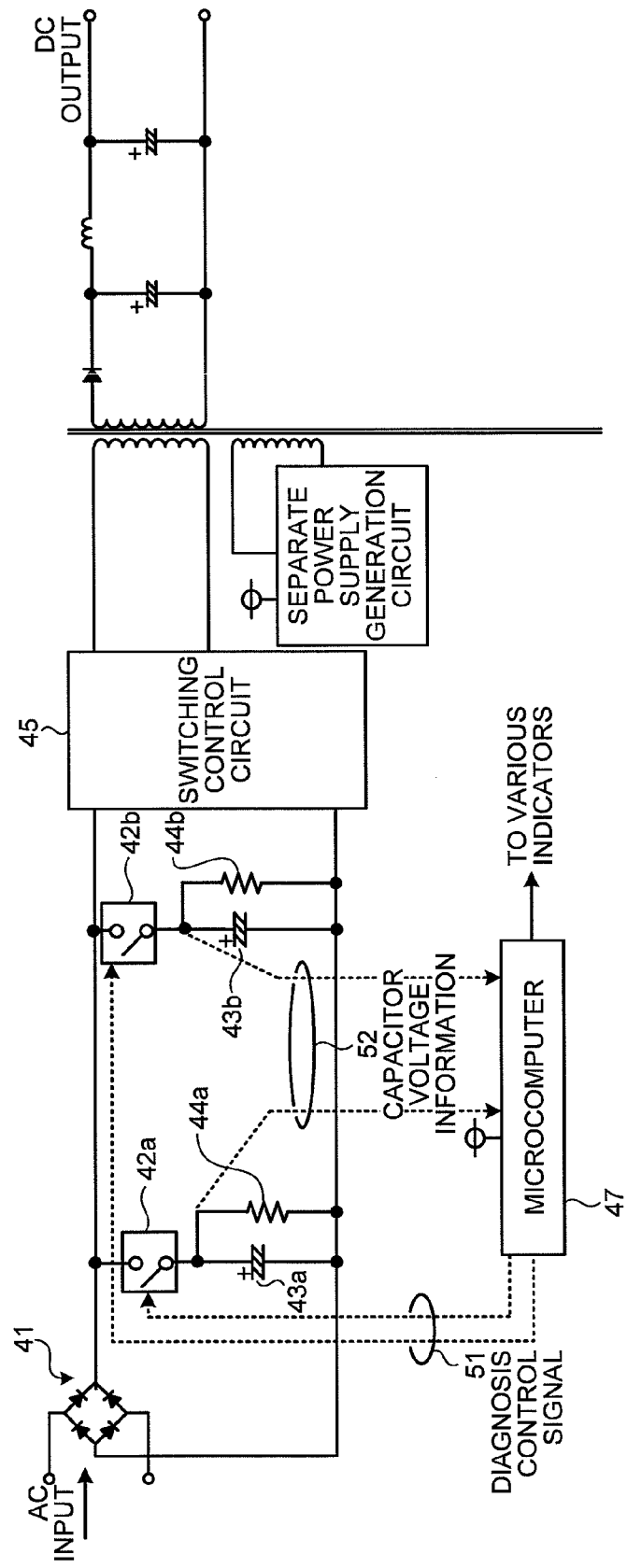
FIG. 7 is a circuit diagram showing the configuration of a power supply device according to a fourth embodiment of the present invention.

FIG. 7 is a circuit diagram showing the configuration of a power supply device according to a fourth embodiment of the present invention. In each of the above embodiments, the duplexed configuration of the smoothing capacitor is provided on the secondary side of the power supply device. In the embodiment, the duplexed configuration of the smoothing capacitor is provided on the primary side of the power supply device. The fundamental connection configuration is the same as that in each of the above embodiments. For example, in the power supply device shown in FIG. 7, a duplexed circuit of smoothing capacitors as shown in FIG. 1 is configured between a full-wave rectifier circuit 41 for converting an alternating-current power to a direct-current power and a switching control circuit 45 for reconverting the converted direct-current power to the alternating-current power, and a microcomputer 47 is configured to control the duplexed circuit. In this case, however, it should be noted that the voltage level of the live line on the primary side in the power supply device is different from the voltage level of the live line on the secondary side in the power supply device and, thus, circuit components such as switches and smoothing capacitors should be selected while taking the difference in voltage level into consideration.

Fifth Embodiment

Figure 8:
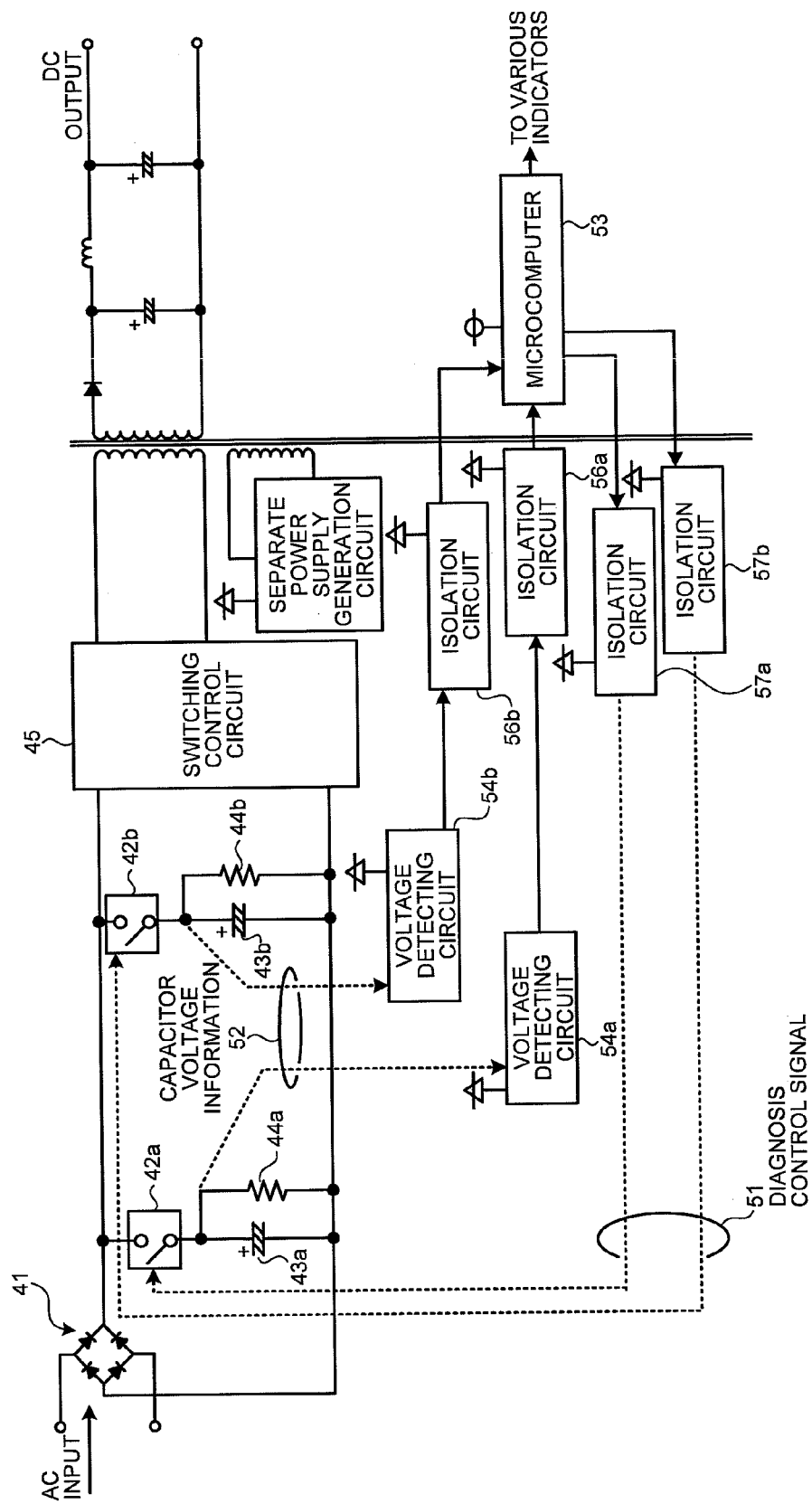
FIG. 8 is a circuit diagram showing the configuration of a power supply device according to a fifth embodiment of the present invention.

FIG. 8 is a circuit diagram showing the configuration of a power supply device according to a fifth embodiment of the present invention. In the configuration of the fourth embodiment, the duplexed configuration of smoothing capacitors is provided on the primary side of the power supply device and, further, the microcomputer for controlling the degradation diagnosis of the smoothing capacitors is also provided on the primary side of the power supply device. On the other hand, in the fifth embodiment, a microcomputer for controlling the degradation diagnosis of smoothing capacitors is provided on the secondary side of the power supply device. In FIG. 7 showing the configuration of the fourth embodiment and FIG. 8 showing the configuration of the fifth embodiment, identical or equivalent configurations have the same reference characters, and the overlapped description thereof will be omitted. Here only processing different from the processing in the fourth embodiment will be explained.

In FIG. 8, a microcomputer 53 is provided on the secondary side of the power supply device. Voltage detecting circuits 54a, 54b that detect each voltage of smoothing capacitors 43a, 43b and isolation circuits 56a, 56b, 57a, 57b that mediate sending of information to and receiving of information from the microcomputer 53 provided on the circuit side located on the secondary side of the power supply device are provided on the primary side of the power supply device. Each of the isolation circuits has the function of absorbing a difference in operating voltage and in signaling format (analog or digital) between the primary circuit and the secondary circuit. For example, in the configuration shown in FIG. 8, a capacitor voltage information 52 for the smoothing capacitor 43a and the capacitor voltage information 52 for the smoothing capacitor 43b detected by the voltage detecting circuits 54a, 54b are transmitted to the microcomputer 53 respectively through the isolation circuits 56a, 56b. A control signal, output from the microcomputer 53, for the degradation diagnosis of the smoothing capacitor 43a and a control signal, output from the microcomputer 53, for the degradation diagnosis of the smoothing capacitor 43b are respectively converted by the isolation circuits 57a, 57b to a diagnosis control signal 51, which are then output to switching elements 42a, 42b.

Sixth Embodiment

Figure 9:
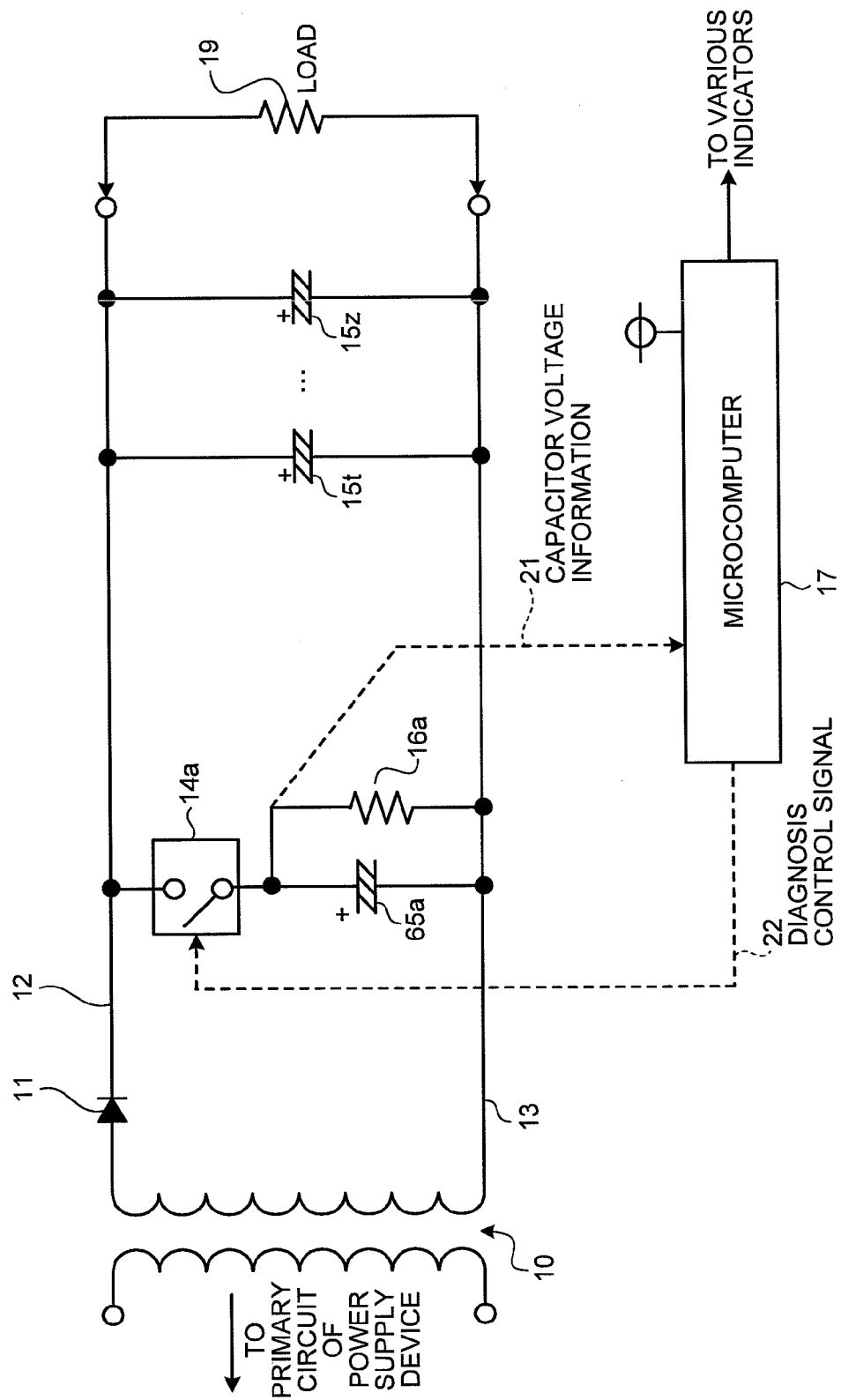
FIG. 9 is a circuit diagram showing the configuration of a power supply device according to a sixth embodiment of the present invention.

FIG. 9 is a circuit diagram showing the configuration of a power supply device according to a sixth embodiment of the present invention. A comparison of the power supply device according to the embodiment with the power supply device according to the second embodiment shown in FIG. 5 shows that the connection of both the capacitor that is directly subjected to a degradation diagnosis, and the capacitor that is not directly subjected to a degradation diagnosis, to the liver conductors is common to the second embodiment and the sixth embodiment. On the other hand, the power supply device according to the second embodiment and the power supply device according to the sixth embodiment are different from each other in the following points.

(1) The second embodiment is based on the assumption that the capacitor connected to the live line (load connecting line 12) through a switching element and the capacitor connected to the live line without through a switching element are substantially identical to each other in life and life degradation characteristics. On the other hand, in the sixth embodiment, a capacitor connected to the live line through a switching element (a capacitor 65a in an example shown in FIG. 9) and capacitors connected to the live line without through a switching element (capacitors 15t, . . . , 15z in the example shown in FIG. 9) are different from each other in life degradation characteristics (while the life may be the same or different). Specifically, in the power supply device according to the embodiment, two capacitors different from each other in life degradation characteristics are used.

(2) In the second embodiment, a plurality of capacitors that are directly subjected to the degradation diagnosis should be provided. On the other hand, the sixth embodiment does not require the provision of a plurality of capacitors that are directly subjected to the degradation diagnosis, and the provision of one capacitor is satisfactory. That is, the provision of one switching element corresponding to the one capacitor suffices for the embodiment. Consequently, as compared with the power supply device shown in FIG. 2, the power supply device according to the embodiment can realize a simplified circuit configuration.

In the configuration shown in FIG. 9, a plurality of capacitors (15t, . . . , 15z), which are not directly subjected to a degradation diagnosis and are connected without through a switching element, are provided. However, the provision of one capacitor suffices for the embodiment.

(Life Degradation Characteristics of Each Capacitor)

Figure 10:
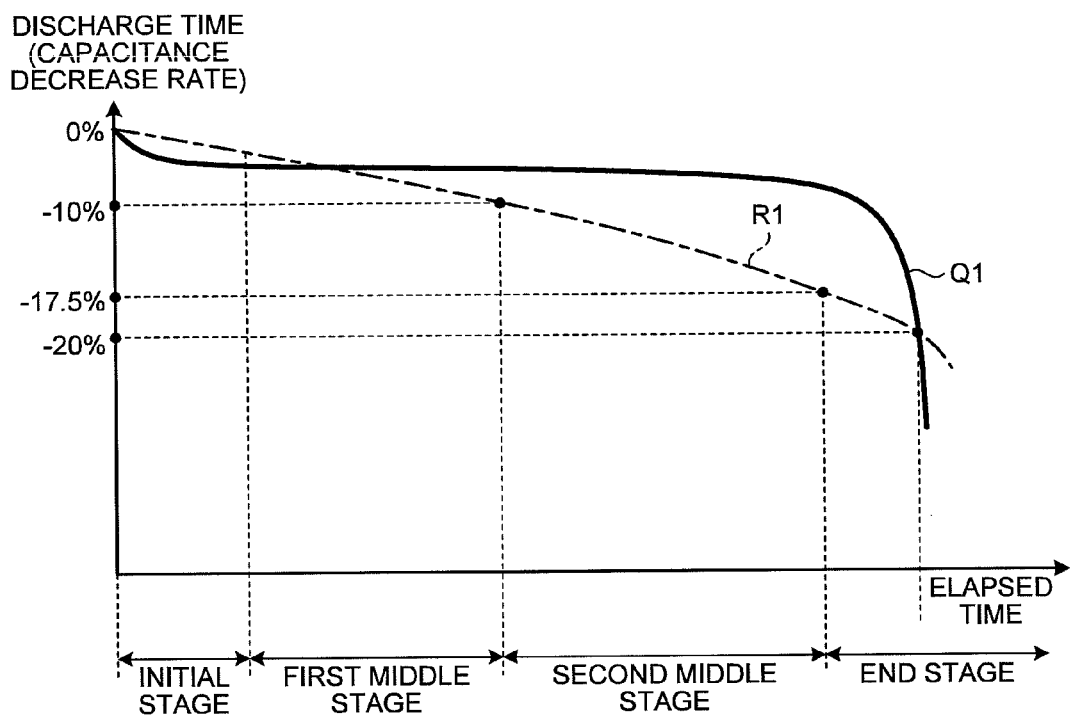
FIG. 10 is a graph showing life degradation characteristics of a capacitor that is directly subjected to a degradation diagnosis and a capacitor that is not directly subjected to the degradation diagnosis.

FIG. 10 is a graph showing life degradation characteristics of a capacitor that is directly subjected to a degradation diagnosis, and a capacitor that is not directly subjected to a degradation diagnosis. In FIG. 10, degradation characteristics R1 indicated by an alternate long and short dash line correspond to the capacitor that is directly subjected to the degradation diagnosis (capacitor 65a in FIG. 9), and degradation characteristics Q1 indicated by a thick solid line correspond to the capacitor that is not directly subjected to the degradation diagnosis (capacitor 15t in FIG. 9). In FIG. 10, the degradation characteristics are related to the degradation curve shown in FIG. 3, and the degradation characteristics of the capacitor 65a are shown as (1) initial to first middle stage: a capacitance decrease rate in the range of 0% to −10%, (2) second middle stage: a capacitance decrease rate in the range of −10% to −17.5%, and (3) end stage: a capacitance decrease rate of not more than −20%.

These classifications are for convenience sake, and any classification may be adopted.

In FIG. 10, the degradation characteristics R1 are such that the capacitance of the capacitor slowly decreases with the elapse of time (corresponding to service time), whereas the degradation characteristics Q1 are such that the capacitance of the capacitor is substantially constant throughout the initial stage, the first middle stage, and the second middle stage and is rapidly lowered at the end stage of the elapsed time.

The degradation characteristics will be reviewed in terms of the prediction accuracy of the degradation diagnosis of the power supply device. In the capacitor having degradation characteristics Q1, only a small variation occurs in discharge time in an first middle stage to second middle stage period and, thus, it is difficult to detect a degraded state and to provide a prediction accuracy necessary for the detection of a degraded state. On the other hand, in the capacitor having degradation characteristics R1, a large variation in discharge time occurs in the same period. Accordingly, a change in discharge time can easily be grasped. Thus, a degraded state can easily be detected, and a prediction accuracy necessary for the detection of a degraded state can be provided.

The degradation characteristics will be reviewed in terms of the performance of the power supply device. In the capacitor having degradation characteristics R1, the capacitance lowers with the elapse of time. Accordingly, the power supply capacity of the power supply device lowers depending upon the degradation characteristics. On the other hand, the capacitor having degradation characteristics Q1 has a substantially constant capacitance in an first middle stage to second middle stage period and thus can maintain a stable power supply capacity.

In the power supply device according to the embodiment, the capacitor that is directly subjected to a degradation diagnosis, and the capacitor that is not directly subjected to a degradation diagnosis, are selected so that, regarding the life degradation characteristics, the elapsed time at which the capacitance decrease of the capacitor that is directly subjected to a degradation diagnosis, is −20% is substantially the same as the elapsed time at which the capacitance decrease of the capacitor that is not directly subjected to a degradation diagnosis, is −20%. However, it should be noted that the capacitors are not limited to capacitors having this life degradation characteristics relationship. For example, when the life of the capacitor that is directly subjected to a degradation diagnosis, is shorter than the life of the capacitor that is not directly subjected to a degradation diagnosis, the degradation diagnosis may be performed at a predetermined threshold value of the capacitance decrease that is lower than −20%. On the other hand, when the life of the capacitor that is directly subjected to a degradation diagnosis, is longer than the life of the capacitor that is not directly subjected to a degradation diagnosis, the degradation diagnosis may be performed at a predetermined threshold value of the capacitance decrease that is higher than −20%.

In the embodiment, the configuration in which the degradation diagnosis of the capacitor provided in the smoothing unit is provided on the secondary side of the power supply device. Alternatively, as with the fourth embodiment, this configuration may be provided on the primary side of the power supply device. Further, as with the fifth embodiment, the microcomputer for controlling the degradation diagnosis of the capacitor may be disposed on the secondary side of the power supply device.

Seventh Embodiment

Figure 11:
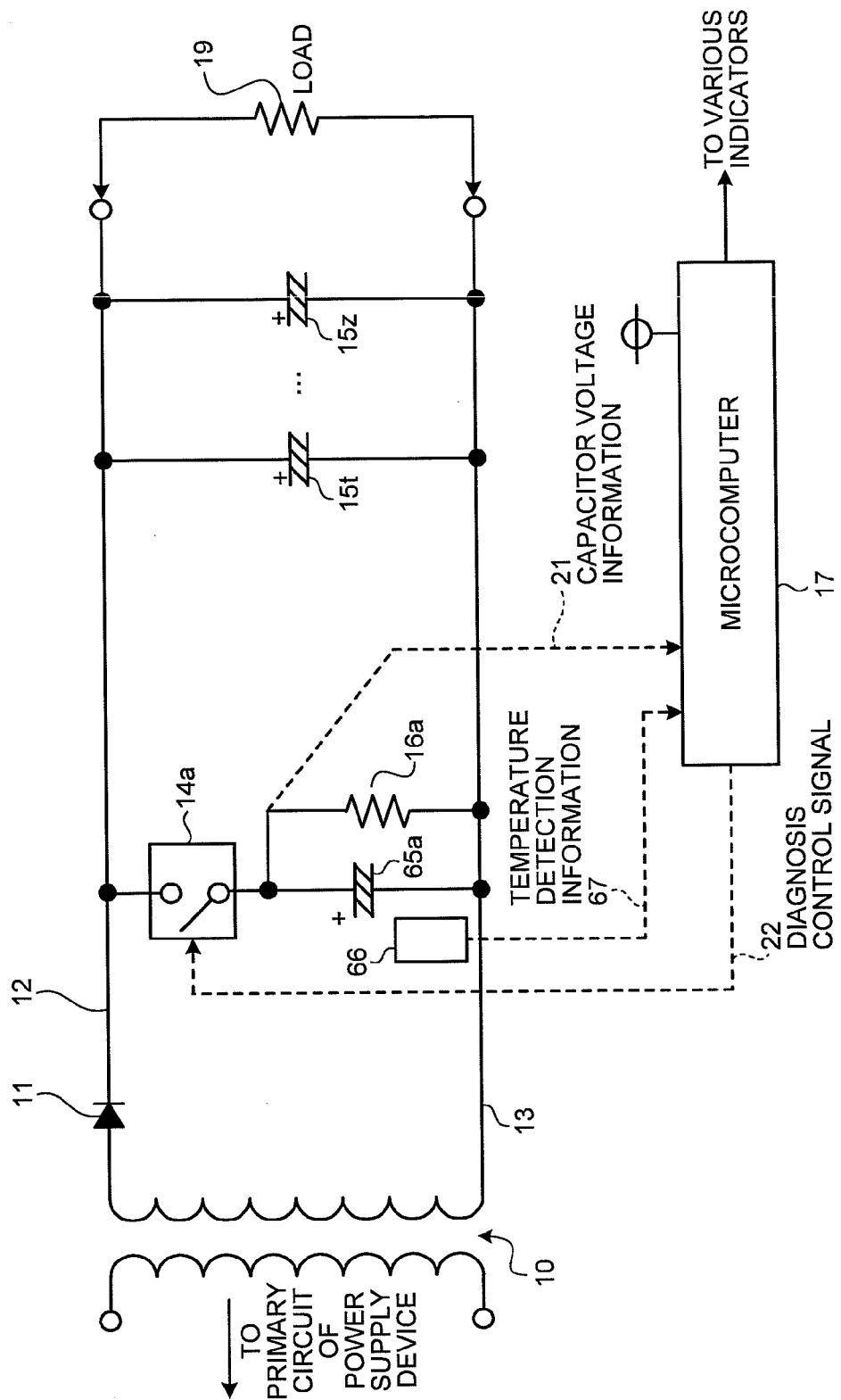
FIG. 11 is a circuit diagram showing the configuration of a power supply device according to a seventh embodiment of the present invention.

FIG. 11 is a circuit diagram showing the configuration of a power supply device according to a seventh embodiment of the present invention. The power supply device according to the embodiment has the same configuration as the power supply device according to the sixth embodiment shown in FIG. 9, except that a temperature detecting unit 66 that can measure the temperature of the capacitor 65a or the temperature of an environment around the capacitor 65a is further provided, and, further, the results of detection by the temperature detecting unit 66 are input into a microcomputer 17. In FIG. 9 showing the configuration of the sixth embodiment and FIG. 11 showing the configuration of the seventh embodiment, identical or equivalent configurations have the same reference characters, and the overlapped description thereof will be omitted. Here only characteristic features of the seventh embodiment different from those of the sixth embodiment will be explained.

Figure 12:
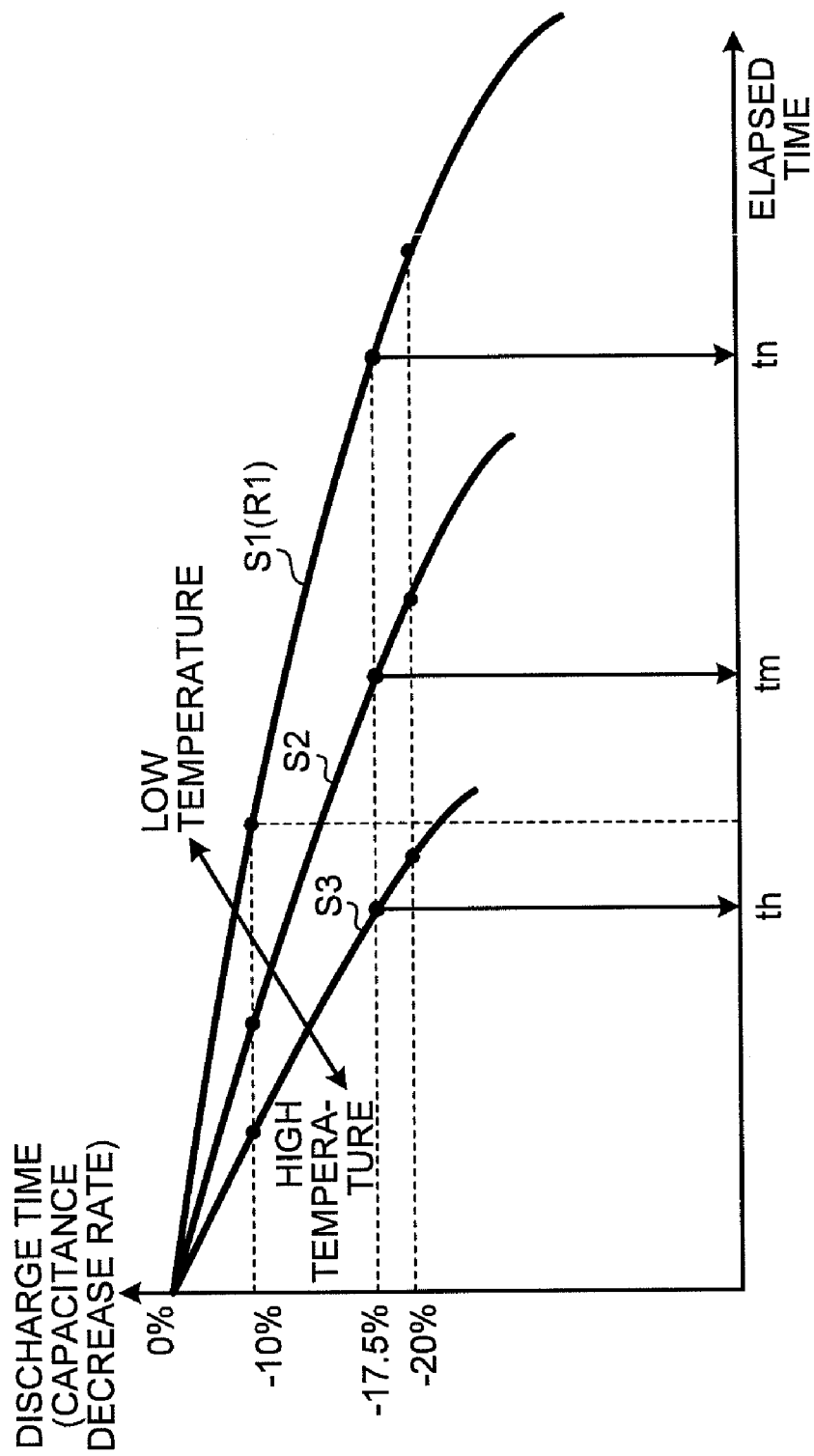
FIG. 12 is a graph showing life degradation characteristics using the temperature as a parameter.

FIG. 12 is a diagram showing life degradation characteristics using the temperature as a parameter. More specifically, in FIG. 12, life degradation characteristics shown as the life degradation characteristics R1 in FIG. 10 are shown as life degradation characteristics S1 (low temperature side), and, further, life degradation characteristics S2 (intermediate temperature side) and life degradation characteristics S3 (high temperature side) which fluctuate with an increase in the temperature of an environment around the capacitor are also shown. As shown in FIG. 12, the life degradation characteristics of the capacitor vary depending upon the environment temperature. For example, different life degradation characteristics provide a large difference in elapsed time that gives an identical capacitance decrease rate. Accordingly, continuous measurement of the environment temperature around the capacitor is a more preferred embodiment from the viewpoint of performing the degradation diagnosis of the capacitor with a high accuracy.

Figure 13:
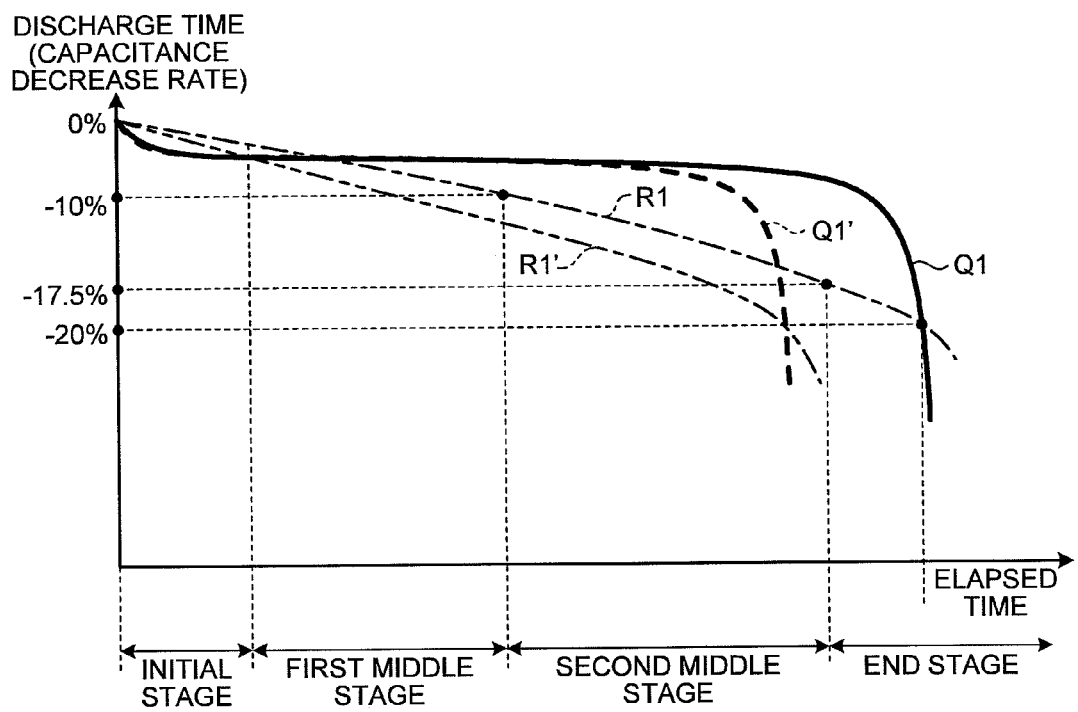
FIG. 13 is a graph showing temperature characteristics of two capacitors having different life degradation characteristics in relationship with the life degradation characteristics shown in FIG. 10.
Figure 14:
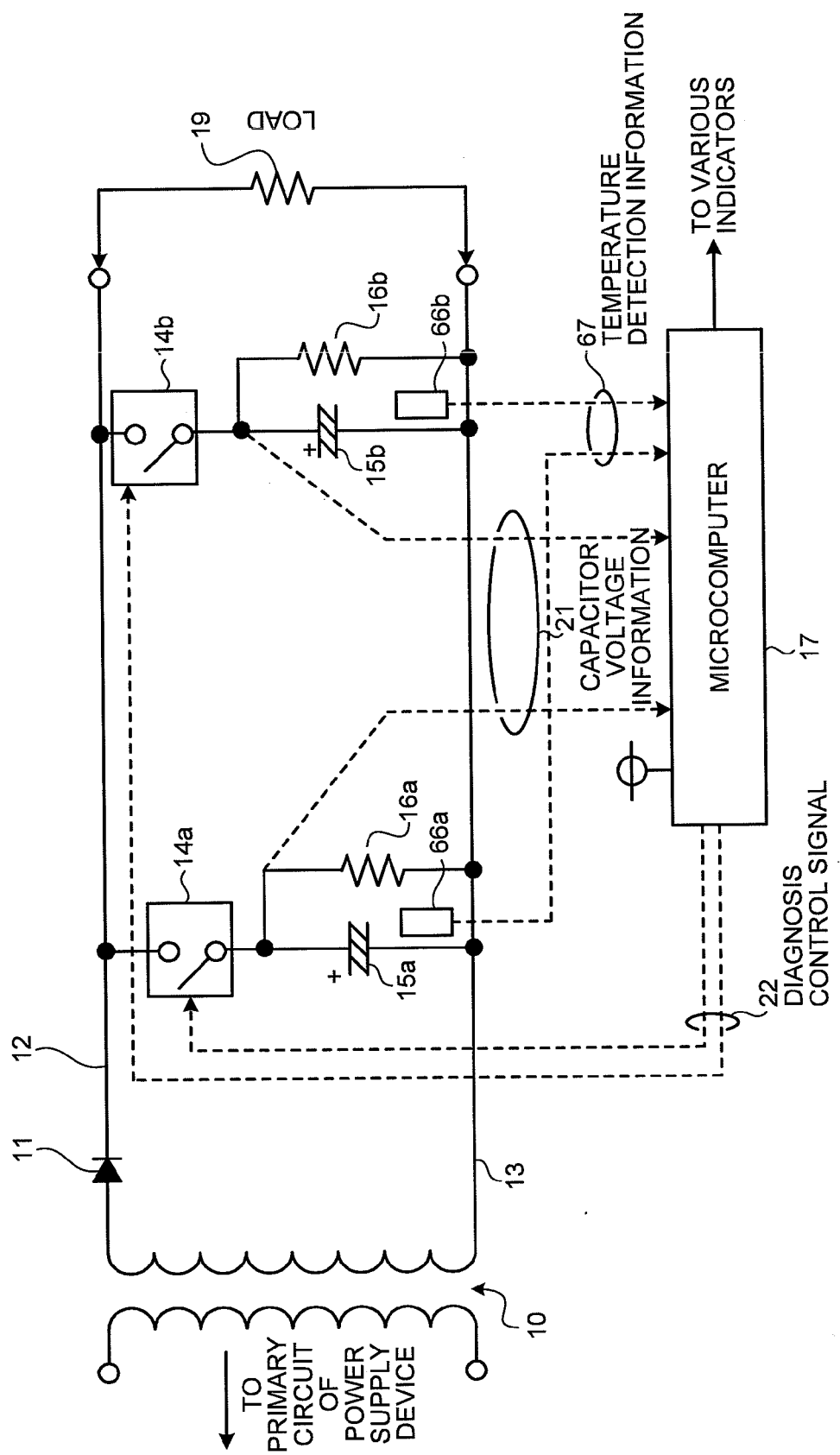
FIG. 14 is a diagram showing the configuration of the configuration of the power supply device according to the first embodiment with a temperature detecting unit additionally provided in the capacitor that is directly subjected to a degradation diagnosis.
Figure 15:
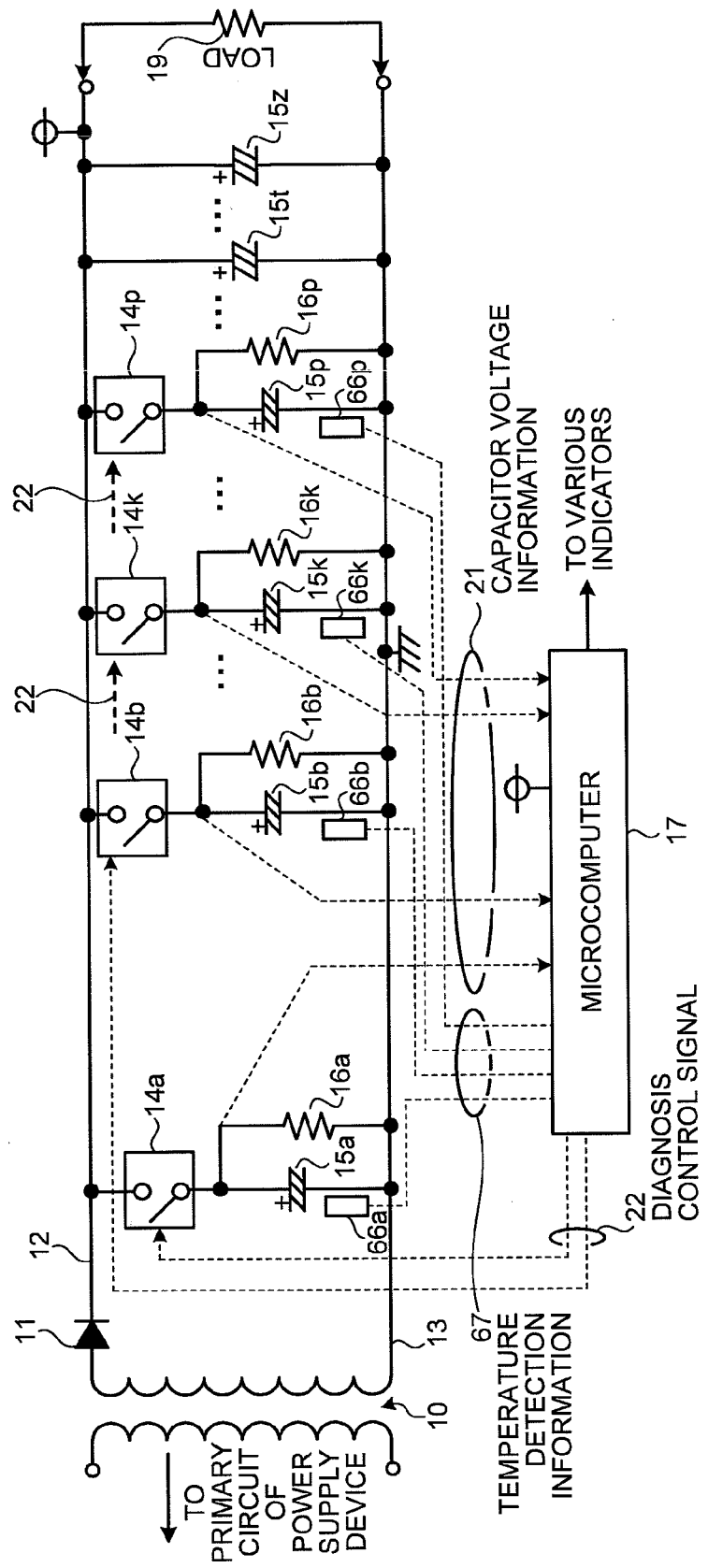
FIG. 15 is a diagram showing the configuration of the power supply device according to the second embodiment with a temperature detecting unit additionally provided in the capacitor that is directly subjected to a degradation diagnosis.
Figure 16:
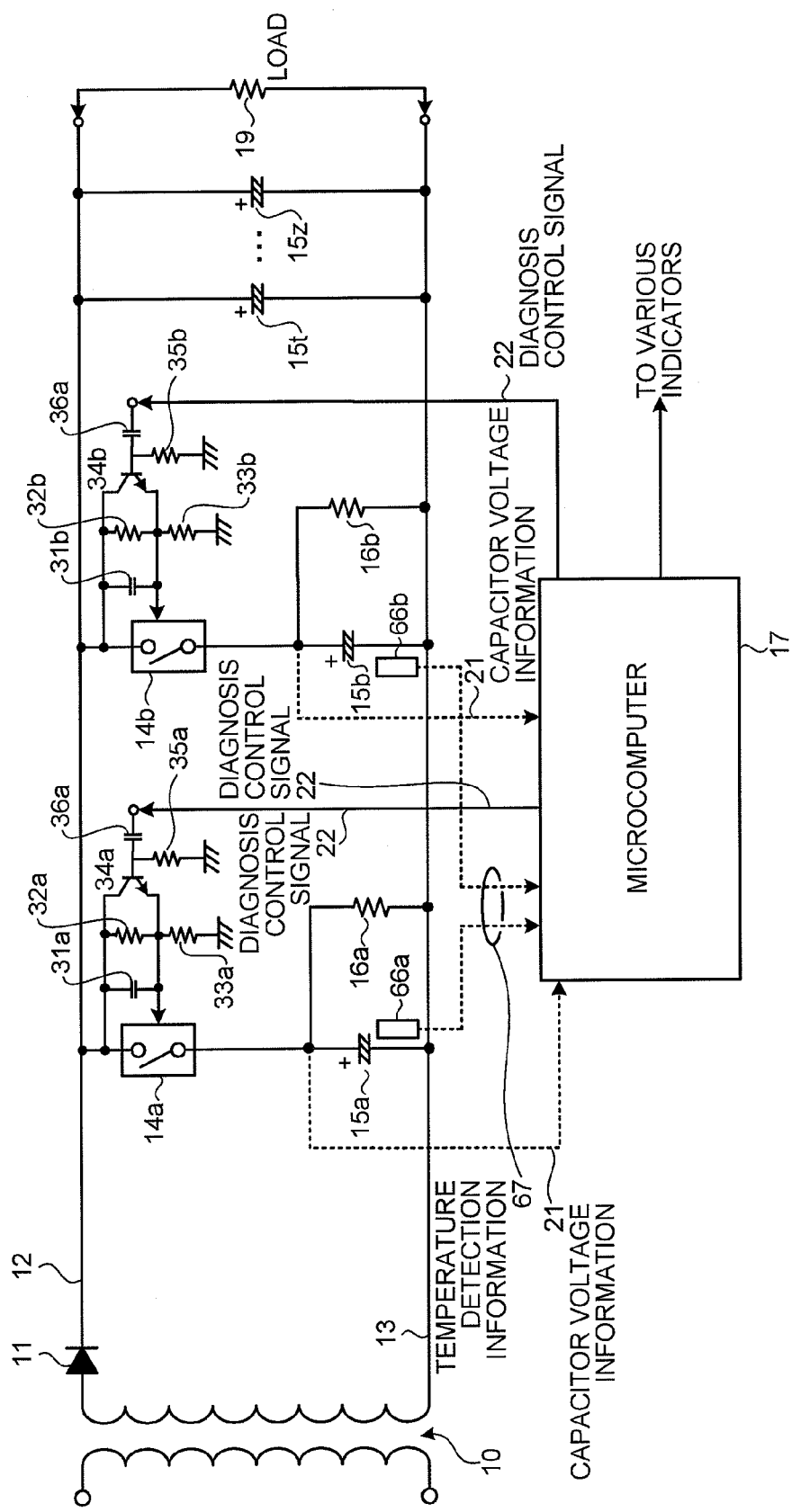
FIG. 16 is a diagram showing the configuration of the power supply device according to the third embodiment with a temperature detecting unit additionally provided in the capacitor that is directly subjected to a degradation diagnosis.
Figure 17:
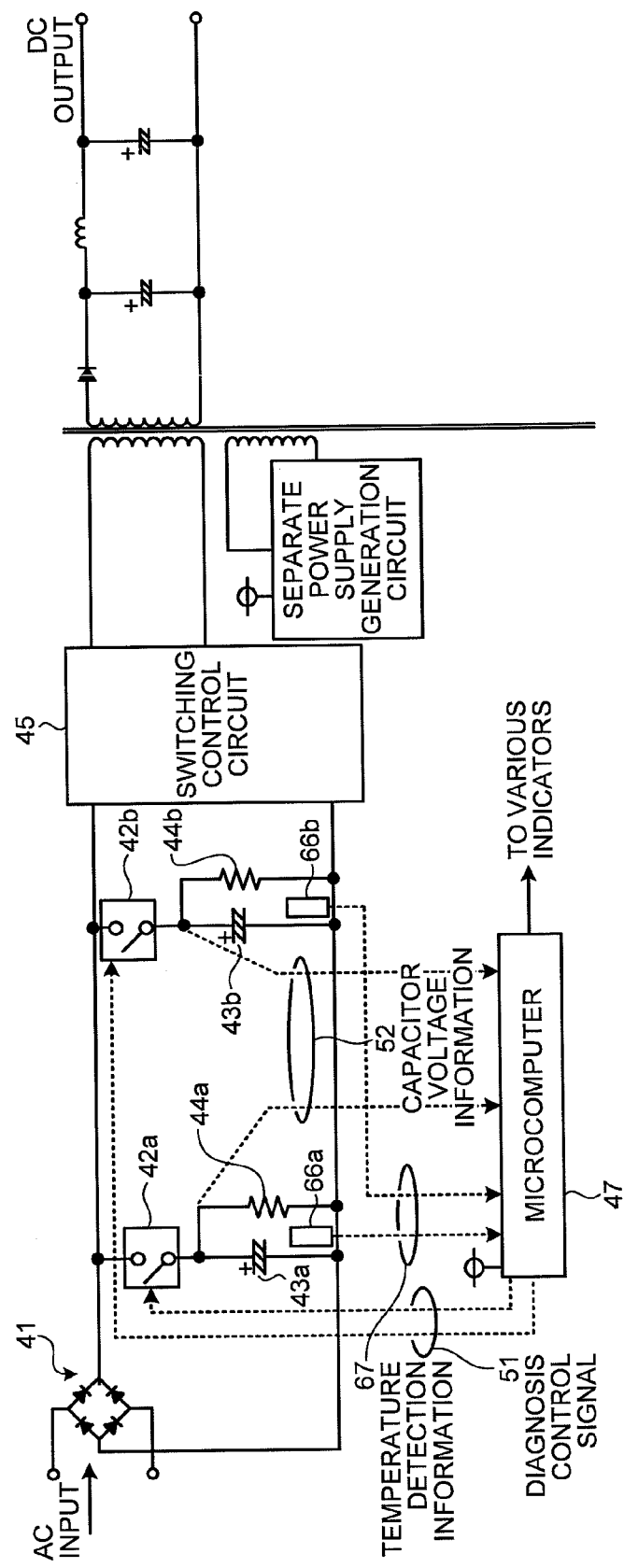
FIG. 17 is a diagram showing the configuration of the power supply device according to the fourth embodiment with a temperature detecting unit additionally provided in the capacitor that is directly subjected to a degradation diagnosis.

FIG. 13 is a graph showing the temperature characteristics of two capacitors having different life degradation characteristics in relationship with the life degradation characteristics shown in FIG. 10. In FIG. 13, the life degradation characteristics Q1, R1 correspond to the life degradation characteristics Q1, R1, respectively, shown in FIG. 10. On the other hand, life degradation characteristics Q1', R1' are, for example, life degradation characteristics in continuous use of the capacitors under an environment of a temperature above the temperature at which the capacitors exhibit the life degradation characteristics Q1, R1. As shown in FIG. 13, when the characteristics of a capacitor that is not directly subjected to a degradation diagnosis, (for example, capacitor 15t: referred to here as "one capacitor") vary depending upon the temperature environment, the characteristics of the capacitor that is directly subjected to a degradation diagnosis, (for example, capacitor 65a: referred to here as "the other capacitor") are likely to fluctuate as in the characteristics of the one capacitor. Accordingly, the prediction accuracy of the life degradation diagnosis of the capacitor can be enhanced by grasping a change in life degradation characteristics caused by the environment temperature of the other capacitor.

For this reason, in the power supply device according to the embodiment, the temperature detecting unit 66 periodically measures the temperature of the capacitor 65a or the temperature of the environment around the capacitor 65a, and measured information 67 on temperature detection is output to the microcomputer 17. The microcomputer 17 can grasp a change in life degradation characteristics of the capacitor 65a that is directly subjected to a degradation diagnosis, caused by the temperature of an environment around the capacitor, based on the input information 67 on temperature detection. The change in life degradation characteristics can easily be grasped by using a reference table holding a relationship, for example, among three elements of temperature, elapsed time, and discharge time.

The power supply device according to the embodiment has the same configuration as the power supply device according to the sixth embodiment shown in FIG. 9, except that the temperature detecting unit 66 is additionally provided. The degradation curve of the capacitor shown in FIG. 3 shows the same temperature characteristics as shown in FIG. 12. Accordingly, also for the power supply devices according to the first to fifth embodiments, as shown in FIGS. 14 to 18, the prediction accuracy of the life diagnosis of the capacitor can be enhanced by providing the same temperature detecting unit as shown in FIG. 11 in a capacitor that is directly subjected to a degradation diagnosis, and grasping a change in life degradation characteristics caused by the temperature of an environment around the capacitor that is directly subjected to a degradation diagnosis.

Eighth Embodiment

FIG. 19 is a diagram showing an example of a configuration of a sequencer system in which one of the power supply devices according to the first to seventh embodiments of the present invention is applied. In the sequencer system shown in FIG. 19, a first control system 100a including a power supply unit 102, a CPU unit 103, an I/O unit 104, a network unit 105, and an other unit 106 mounted on a base unit 101 is configured, and is connected through the network unit 105 to other control systems, i.e., a second control system 10b and a third control system 100c.

The power supply unit 102 has the life diagnosis function. A life detection signal 110 showing the results of the life diagnosis is transmitted to the I/O unit 104, for example, through a connector 107 for external output provided in the power supply unit 102 and a connector 108 for external input provided in the I/O unit 104. The CPU unit 103 can allow the results of diagnosis performed by the power supply unit 102 to be displayed on an indicator 109 by reading information on the results of the diagnosis transmitted to the I/O unit 104. The results of the diagnosis performed by the power supply unit 102 may also be transmitted as a life detection signal 120 indicated by a broken line arrow in FIG. 19 through the base unit 101 to the CPU unit 103.

Even in control systems not provided with a CPU unit and an indicator as in the second control system 100b and the third control system 100c, the life detection signal 110 as the results of the life diagnosis may be transmitted through the network unit to the first control system. Also in this system configuration in the example shown in FIG. 19, information on the results of the diagnosis transmitted from the second control system 100b and the third control system 100c through the network unit can be displayed on the indicator 109 in the first control system 100a by reading the information by the CPU unit 103 in the first control system 100a.

INDUSTRIAL APPLICABILITY

As described above, the power supply device and sequencer system according to the present invention are useful as a device that can realize an online life diagnosis, and are particularly suitable, for example, when it is desired to ensure the prediction accuracy of the life diagnosis while performing the life diagnosis online.

The invention claimed is:

1. A power supply device comprising:
a smoothing unit that smoothes a rectified output of an alternating-current power, the smoothing unit including a capacitor that includes a first capacitor directly subjected to a degradation diagnosis and at least one second capacitor not directly subjected to the degradation diagnosis; and
a first discharge resistor connected to both ends of the first capacitor in parallel, wherein
during a normal operation of the power supply device, the first capacitor and the second capacitor are connected electrically to a live line, while during the degradation diagnosis, the first capacitor is disconnected electrically from the live line, and
the first capacitor and the second capacitor have life degradation characteristics such that, in a period of time until the second capacitor reaches an end of its life, a first period where an amount of change in discharge time of the first capacitor is larger than an amount of change in discharge time of the second capacitor is longer than a second period where the amount of change in discharge time of the second capacitor is larger than the amount of change in discharge time of the first capacitor.

2. The power supply device according to claim 1, wherein the first capacitor is connected to the live line through a switching element.

3. The power supply device according to claim 2, further comprising a starting unit that quickly starts the switching element in disconnecting the first capacitor electrically from the live line and slowly starts the switching element in connecting the first capacitor electrically to the live line.

4. The power supply device according to claim 1, further comprising a temperature detecting unit that measures either one of a temperature of the first capacitor and an ambient temperature around the first capacitor, wherein
the power supply device determines a change in life degradation characteristics of the first capacitor based on information on the temperature measured by the temperature detecting unit.

5. The power supply device according to claim 1, further comprising a display unit that displays thereon degradation states of the first capacitor and the second capacitor.

6. The power supply device according to claim 5, wherein the display unit displays the degradation states of the capacitors in at least three separated state classes of a normal state, a replacing recommendation state, and a degraded state.

7. A sequencer system comprising:
a power supply device according to claim 1; and
a CPU unit that exchanges a signal representing a result of a life diagnosis performed by the power supply device.

8. A power supply device comprising:
a smoothing unit that smoothes a rectified output of an alternating-current power, the smoothing unit including a capacitor that includes a plurality of first capacitors directly subjected to a degradation diagnosis and at least one second capacitor not directly subjected to the degradation diagnosis; and
a first discharge resistor connected to both ends of each of the first capacitors in parallel, wherein
during a normal operation, the first capacitors and the second capacitor are connected electrically to a live conductor, and
during the degradation diagnosis, at least one of the first capacitors is connected electrically to the live line, and a first capacitor that is not connected electrically to the live line is subjected to the degradation diagnosis.

9. The power supply device according to claim 8, wherein the first capacitor is connected to the live line through a switching element.

10. The power supply device according to claim 9, further comprising a starting unit that quickly starts the switching element in disconnecting the first capacitor electrically from the live line and slowly starts the switching element in connecting the first capacitor electrically to the live line.

11. The power supply device according to claim 8, further comprising a temperature detecting unit that measures either one of a temperature of the first capacitor and an ambient temperature around the first capacitor, wherein
the power supply device determines a change in life degradation characteristics of the first capacitor based on information on the temperature measured by the temperature detecting unit.

12. The power supply device according to claim 8, further comprising a display unit that displays thereon degradation states of the first capacitor and the second capacitor.

13. The power supply device according to claim 12, wherein the display unit displays the degradation states of the capacitors in at least three separated state classes of a normal state, a replacing recommendation state, and a degraded state.

14. A sequencer system comprising:
a power supply device according to claim 8; and
a CPU unit that exchanges a signal representing a result of a life diagnosis performed by the power supply device.

15. A power supply device comprising:
a smoothing unit that smoothes a rectified output of an alternating-current power, the smoothing unit including a capacitor that includes a first capacitor and a second capacitor; and
a first discharge resistor and a second discharge resistor are connected to both ends of the first capacitor and the second capacitor in parallel, respectively, wherein
during a normal operation, both the first capacitor and the second capacitor are connected electrically to a live line, and
during a degradation diagnosis, the first capacitor and the second capacitor are alternately connected electrically to the live line at a predetermined timing, and either one of the first capacitor and the second capacitor not electrically connected to the live line is subjected to the degradation diagnosis.

16. The power supply device according to claim 15, wherein the first capacitor and the second capacitor have capacitances corresponding to capacitances at a time when the first capacitor and the second capacitor are solely operated, respectively.

17. The power supply device according to claim 15, wherein each of the first capacitor and the second capacitor is connected to the live line through a switching element.

18. The power supply device according to claim 17, further comprising a starting unit that quickly starts the switching element in disconnecting the first capacitor and the second capacitor electrically from the live line and slowly starts the switching element in connecting the first capacitor and the second capacitor electrically to the live line.

19. The power supply device according to claim 15, further comprising a display unit that displays thereon degradation states of the first capacitor and the second capacitor.

20. The power supply device according to claim 19, wherein the display unit displays the degradation states of the capacitors in at least three separated state classes of a normal state, a replacing recommendation state, and a degraded state.

21. The power supply device according to claim 15, further comprising a temperature detecting unit that measures either one of a temperature of the first capacitor and an ambient temperature around the first capacitor, wherein
the power supply device determines a change in life degradation characteristics of the first capacitor based on information on the temperature measured by the temperature detecting unit.

22. A sequencer system comprising:
a power supply device according to claim 15; and
a CPU unit that exchanges a signal representing a result of a life diagnosis performed by the power supply device.

* * * * *